(12) United States Patent
Kulkarni

(10) Patent No.: US 9,905,278 B2
(45) Date of Patent: Feb. 27, 2018

(54) MEMORY DEVICE INCLUDING ENCODED DATA LINE-MULTIPLEXER

(71) Applicant: Intel Corporation, Santa Clara, CA (US)

(72) Inventor: Jaydeep Kulkarni, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 48 days.

(21) Appl. No.: 14/859,884

(22) Filed: Sep. 21, 2015

(65) Prior Publication Data

US 2017/0084316 A1  Mar. 23, 2017

(51) Int. Cl.
  *G11C 7/12* (2006.01)
  *G11C 8/08* (2006.01)
  *G11C 8/10* (2006.01)

(52) U.S. Cl.
  CPC .......... *G11C 7/12* (2013.01); *G11C 8/08* (2013.01); *G11C 8/10* (2013.01)

(58) Field of Classification Search
  CPC .......... G11C 7/12; G11C 8/08; G11C 8/10
  See application file for complete search history.

(56) References Cited

U.S. PATENT DOCUMENTS

| 7,050,354 | B2* | 5/2006 | Nicholes | G06F 17/5045 365/194 |
| 7,480,183 | B2* | 1/2009 | Mori | G11C 16/24 365/185.2 |
| 8,619,482 | B1 | 12/2013 | Bui et al. | |
| 2009/0303775 | A1 | 12/2009 | Kulkarni et al. | |
| 2010/0103719 | A1 | 4/2010 | Lee | |
| 2013/0141962 | A1 | 6/2013 | Liaw | |
| 2013/0335065 | A1* | 12/2013 | Fugate | G01R 33/0035 324/202 |
| 2015/0103613 | A1 | 4/2015 | Schubert et al. | |

OTHER PUBLICATIONS

"International Application Serial No. PCT/US2016/048234, International Search Report dated Nov. 24, 2016", 3 pgs.
"International Application Serial No. PCT/US2016/048234, Written Opinion dated Nov. 24, 2016", 9 pgs.
Cui, Wei, "Design of SmallArea and Low Power Consumption Mask ROM", IEEE, (2007), 4 pgs.

* cited by examiner

*Primary Examiner* — Tri Hoang
(74) *Attorney, Agent, or Firm* — Schwegman Lundberg & Woessner, P.A.

(57) ABSTRACT

Some embodiments include apparatuses and methods having non-volatile memory cells, a data line associated with a group of non-volatile memory cells of the non-volatile memory cells, a first transistor coupled to the data line and a node, a second transistor coupled to the node and an additional node, a pull-up component coupled to the node and a supply node, and an additional pull-up component coupled to the additional node and the supply node.

16 Claims, 10 Drawing Sheets

MEMORY DEVICE INCLUDING ENCODED DATA LINE-MULTIPLEXER

TECHNICAL FIELD

Embodiments described herein pertain to memory in electronic systems. Some embodiments relate to selection of data lines in memory devices.

BACKGROUND

Many electronic devices or systems, such as computers, tablets, and cellular phones, have memory to store information (e.g., data). Some conventional memory devices (e.g., read-only-memory (ROM) devices) may be used to store fixed information, such as micro-codes and other information. Some of the conventional memory devices may be limited to a relatively higher minimum operating voltage and a specific noise tolerance and speed. Such limitations may make some conventional memory devices unsuitable for some applications.

DETAILED DESCRIPTION

Figure 1:
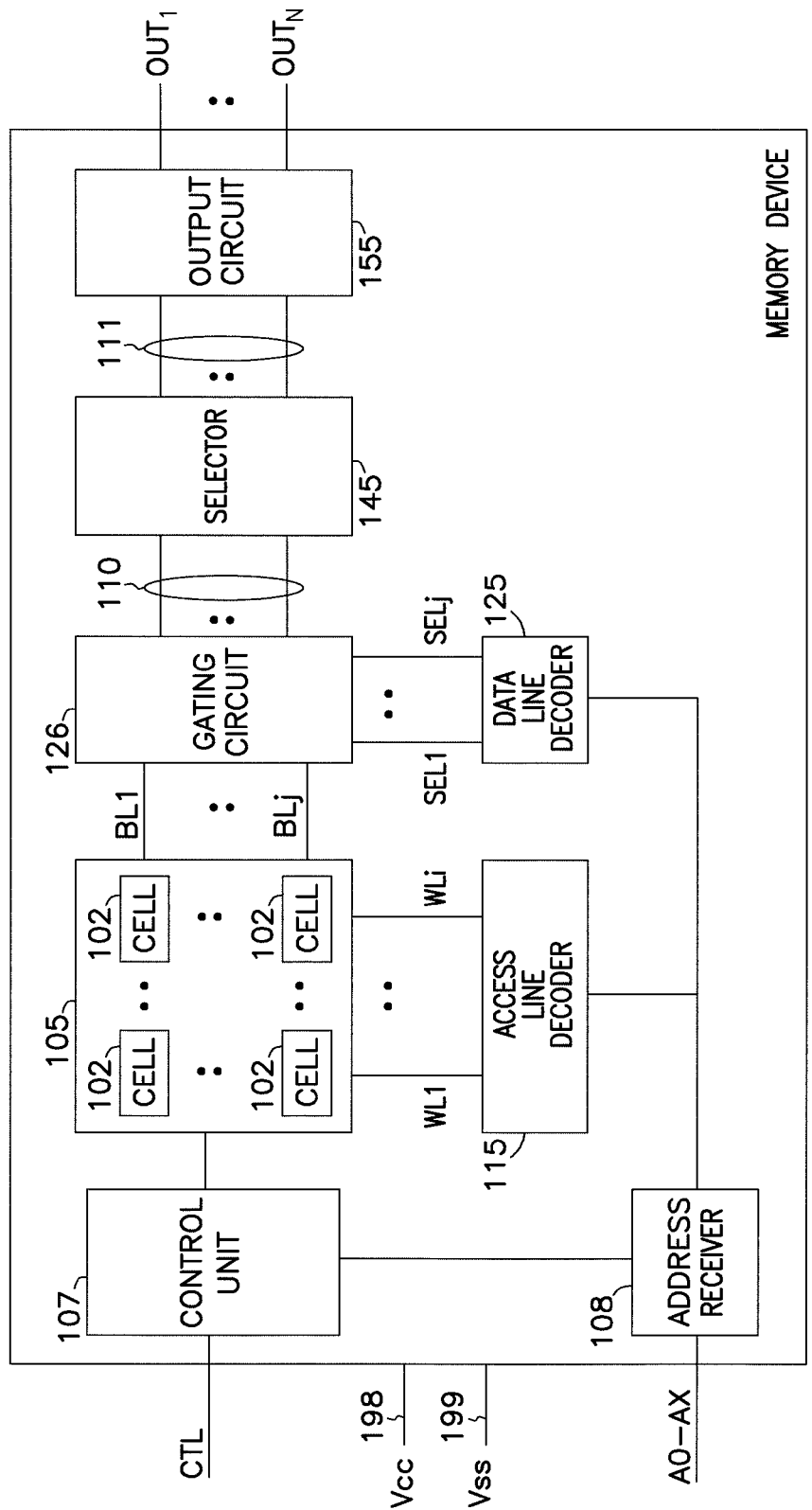
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a non-volatile memory device. For example, device 100 can include a ROM (e.g., mask ROM) device. As shown in FIG. 1, memory device 100 can include a memory array 105 having memory cells 102 that can be arranged in a matrix (e.g., rows and columns). Memory device 100 can include access lines $WL_1$ through $WL_i$ and data lines $BL_1$ through $BL_j$ associated with memory cells 102. Access lines $WL_1$ through $WL_i$ can include or can be part of word lines of memory device 100. Data lines $BL_1$ through $BL_j$ can include or can be part of bit lines (e.g., local bit lines) of memory device 100. Memory device 100 can include nodes (e.g., supply nodes) 198 and 199 to receive supply voltage Vcc and Vss. Supply voltage Vcc can include voltage having a positive value (e.g., 1.2V or other values). Supply voltage Vss can include zero volts (e.g., ground potential).

Memory device 100 can include a control unit 107, an address receiver (e.g., address buffer) 108, an access line (e.g., row line or word line) decoder 115, and a data line (e.g., column line or bit line) decoder 125, a gating (e.g., column multiplexing) circuit 126, a selector 145, and an output circuit 155. Control unit 107 can control operations (e.g., read operations) of memory device 100 based on control information (e.g., control signals) CTL. Address receiver 108 can receive address information (e.g., address signals) A0-AX during an operation (e.g., a read operation) of retrieving information from memory cells 102.

During a read operation to retrieve information from selected memory cells among the memory cells 102, access line decoder 115 and data line decoder 125 can decode address information A0-Ax to selectively access the selected memory cells through access lines $WL_1$ through $WL_i$ and data lines $BL_1$ through $BL_j$. Gating circuit 126 and selector 145 can selectively form circuit paths between data lines $BL_1$ through $BL_j$ and output circuit 155 through nodes 110 and nodes 111. Output circuit 155 can generate output information $OUT_1$ through $OUT_N$ having values that indicate the values of the information stored in the selected memory cells.

Memory cells 102 can include non-volatile memory cells, such that information stored in memory cells 102 can be retained (e.g., information is not lost) if the supply power (e.g., voltage Vcc) is disconnected from memory device 100.

Each of memory cells 102 can be configured (e.g., structured) to store one bit of information. The information stored in each of memory cells 102 can have value of either binary 0 or binary 1. Information stored in memory cells 102 can be read-only information. Memory cells 102 can include one-time programmable memory cells, such that the value of information stored in memory cells 102 may be fixed, which is unchangeable (e.g., may not be updated) after the information is stored in the memory cells 102. In an alternative arrangement, memory cells 102 can include multiple-time programmable memory cells, such that the value of information stored in memory cells 102 may be changed (e.g., may be updated) after the information is stored in memory cells 102.

One skilled in the art would recognize that a memory device (e.g., a ROM device) such as memory device 100 includes many additional components, several of which are not shown in FIG. 1 so as not to obscure the embodiments described herein.

Memory device 100 can include a memory device described below with reference to FIG. 2 through FIG. 10.

Figure 2:
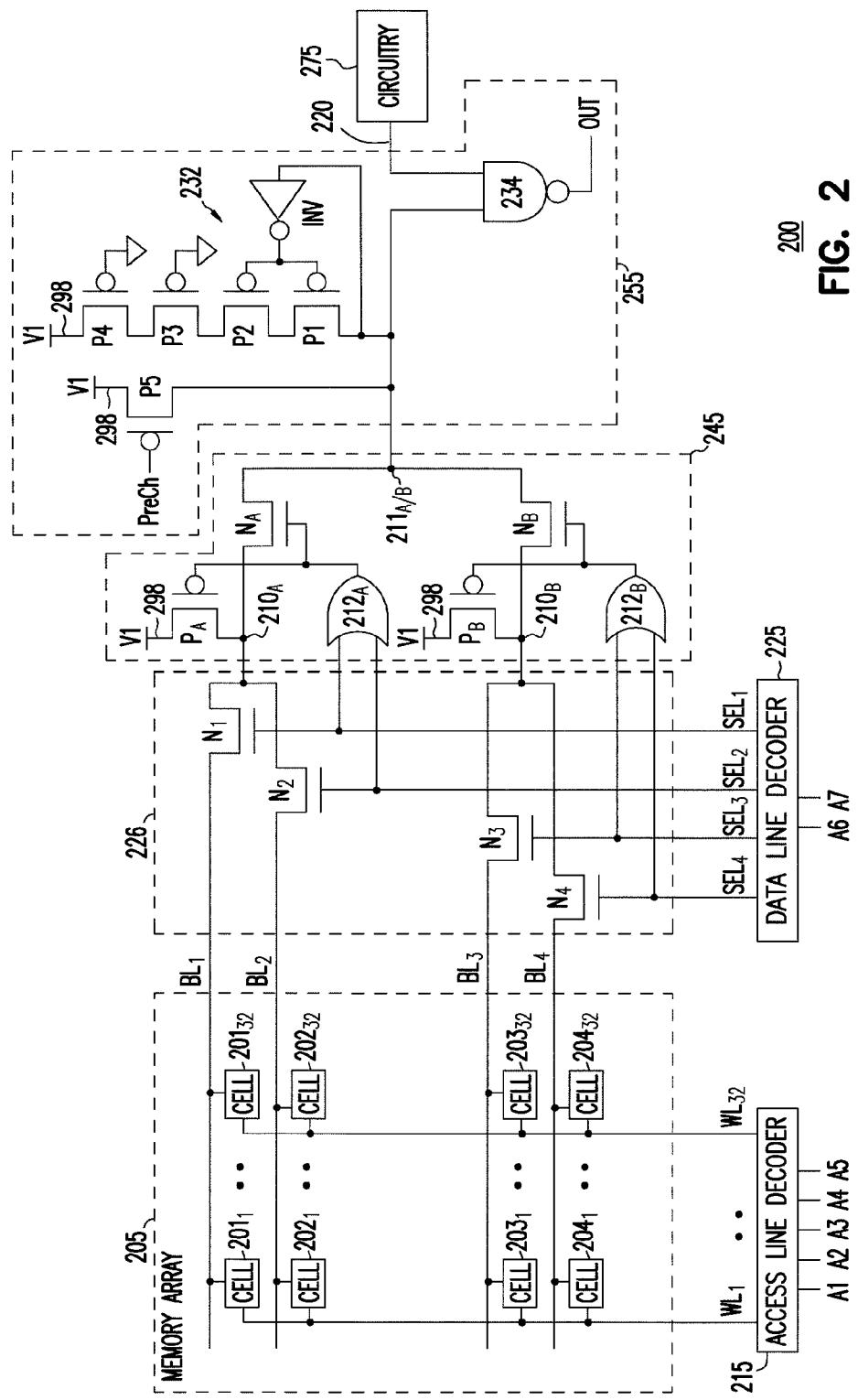
FIG. 2 shows a schematic diagram of a memory device including a data line-multiplexer, according to some embodiments described herein.

FIG. 2 shows a schematic diagram of a memory device 200 including a data line-multiplexer, according to some embodiments described herein. Memory device 200 can correspond to memory device 100 of FIG. 1. For example, as shown in FIG. 2, memory device 200 can include a memory array 205, a gating circuit 226, an access line decoder 215, a data line decoder 225, a selector 245, and output circuit 255. Access line decoder 215 and data line decoder 225 can receive and decode address information (e.g., address bits in the form of signals) A1, A2, A3, A4, A5, A6, and A7, which can correspond to address information A0-AX of FIG. 1. As described in more detail below, gating circuit 226 and selector 245 may form part of an encoded data line-multiplexer (MUX) of memory device 200.

As shown in FIG. 2, memory array 205 can include memory cells, such as memory cells $201_1$ through $201_{32}$ (e.g., 32 memory cells), $202_1$ through $202_{32}$ (e.g., 32 memory cells), $203_1$ through $203_{32}$ (e.g., 32 memory cells), $204_1$ through $204_{32}$ (e.g., 32 memory cells). These memory cells are collectively referred to as "the memory cells" of memory array 205. For simplicity, FIG. 2 shows only two of 32 memory cells in each group of memory cells $201_1$ through $201_{32}$, group of memory cells $202_1$ through $202_{32}$, group of memory cells $203_1$ through $203_{32}$, and group of memory cells $204_1$ through $204_{32}$. The memory cells of memory array 205 can correspond to memory cells (e.g., non-volatile memory cells) 102 of FIG. 1.

Figure 3B:
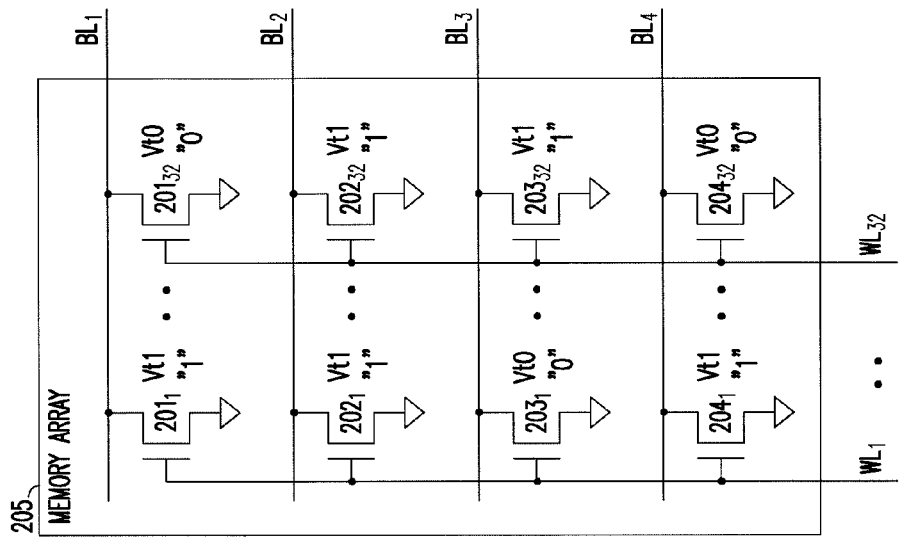
FIG. 3A and FIG. 3B show schematic diagrams of example structures of the memory cells of the memory device of FIG. 2, according to some embodiments described herein.
Figure 3A:
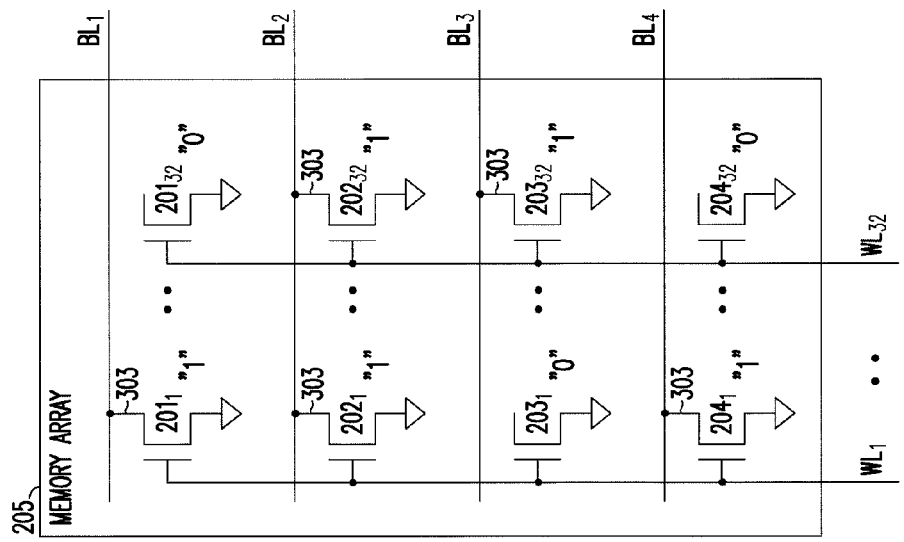

The memory cells of memory array 205 may be arranged in rows and column, as shown in FIG. 2. Each of the memory cells of memory array 205 can be configured (e.g., structured) to store information (e.g., one bit of information). FIG. 3A and FIG. 3B (described below) show schematic diagrams of example structures of the memory cells of memory array 205 and corresponding values (e.g., binary 0 and binary 1) of the stored information.

As shown in FIG. 2, memory device 200 can include access lines $WL_1$ through $WL_{32}$ (e.g., 32 access lines) that can include or can be part of word lines of memory device 200. For simplicity, only two of the 32 access lines $WL_1$ through $WL_{32}$ are shown in FIG. 2. Memory device 200 can include data lines (e.g., four data lines) $BL_1$, $BL_2$, $BL_3$, and $BL_4$, which can include or can be part of bit lines (e.g., local bit lines) of memory device 200.

Each of access lines $WL_1$ through $WL_{32}$ can be associated with (e.g., assigned to) one memory cell from each of data lines $BL_1$ through $BL_4$. For example, access line $WL_1$ can be associated with memory cell $201_1$, $202_1$, $203_1$, and $204_1$. Access line $WL_{32}$ can be associated with memory cell $201_{32}$, $202_{32}$, $203_{32}$, and $204_{32}$. FIG. 2 shows memory device 200 including 32 access lines $WL_1$ through $WL_{32}$ as an example. Memory device 200 may include a different number of access lines (e.g., 64, 128, or another number of access lines). The number of access lines of memory device 200 may be equal to the number of memory cells associated with each of data lines $BL_1$ through $BL_4$. For example, since the portion of memory device 200 shown in FIG. 2 includes an example of 32 memory cells associated with each of data lines $BL_1$ through $BL_4$, memory device 200 includes 32 access lines $WL_1$ through $WL_{32}$.

Each of data lines $BL_1$ through $BL_4$ can be associated with (e.g., assigned to) a different group of memory cells. For example, data line $BL_1$ can be associated with memory cells $201_1$ through $201_{32}$. Data line $BL_2$ can be associated with memory cells $202_1$ through $202_{32}$. Data line $BL_3$ can be associated with memory cells $203_1$ through $203_{32}$. Data line $BL_4$ can be associated with memory cells $204_1$ through $204_{32}$. FIG. 2 shows memory device 200 including four data lines $BL_1$ through $BL_4$, as an example. Memory device 200 may include a different number of data lines (e.g., 8, 16, or another number of data lines). Further, FIG. 2 shows an example where each of data lines $BL_1$ through $BL_4$ is associated with a group of 32 memory cells. Each of data lines $BL_1$ through $BL_4$ may be associated with a different number of memory cells (e.g., 64, 128, or another number of memory cells).

Gating circuit 226 can include transistors (e.g., column multiplexing transistors) $N_1$, $N_2$, $N_3$, and $N_4$ coupled to corresponding data lines $BL_1$ through $BL_4$. Transistors $N_1$, $N_2$, $N_3$, and $N_4$ can include n-channel transistors (e.g., n-channel metal oxide semiconductor (NMOS) transistors). Memory device 200 can include select lines $SEL_1$ through $SEL_4$ coupled to the gate terminals (transistor gates) of transistors $N_1$, $N_2$, $N_3$, and $N_4$, respectively, and to outputs (e.g., output nodes 1, 2, 3, and 4) of data line decoder 225. Memory device 200 may use select lines $SEL_1$ through $SEL_4$ to control (e.g., turn on or turn off) transistors $N_1$, $N_2$, $N_3$, and $N_4$, respectively.

Selector 245 can include transistors $N_A$ and $N_B$, pull-up components (e.g., local data line pull-up components) $P_A$ and $P_B$, and logic gates $212_A$ and $212_B$. Transistors $N_A$ and $N_B$ can include n-channel transistors (e.g., NMOS transistors). Pull-up components $P_A$ and $P_B$ can include p-channel transistors (e.g., p-channel metal oxide semiconductor (PMOS) transistors). Pull-up component $P_A$ can be coupled between node a $210_A$ (e.g., an intermediate node) and a supply node 298. Pull-up component $P_B$ can be coupled between a node $210_B$ (e.g., an intermediate node) and a supply node 298. Supply node 298 can receive a voltage V1, which can be a supply voltage (e.g., Vcc or Vdd) or generated from the supply voltage of memory device 200. Supply node 298 can be part of a supply rail (e.g., positive power rail) of memory device 200.

FIG. 2 shows pull-up component $P_A$ including only a single transistor coupled between node $210_A$ and supply node 298 as an example. Pull-up component $P_A$ may include a circuit element (or circuit elements) different from a single transistor as long as a circuit path can be selectively formed (or not be formed) between node $210_A$ and supply node 298 during a read operation of retrieving information from a memory cell of memory array 205. Similarly, FIG. 2 shows pull-up component $P_B$ including only a single transistor coupled between node $210_B$ and supply node 298 as an example. Pull-up component $P_B$ may include a circuit element (or circuit elements) different from a single transistor as long as a circuit path can be selectively formed (or not be formed) between node $210_B$ and supply node 298 during a read operation of retrieving information from a memory cell of memory array 205.

Logic gates $212_A$ and $212_B$ can include logic OR gates. Logic gate $212_A$ can operate to control (e.g., turn on or turn off) transistor $N_A$ and pull-up component $P_A$ based on the levels (e.g., voltage levels) of the signals on select lines $SEL_1$ and $SEL_2$. Logic gate $212_B$ can operate to control (e.g., turn on or turn off) transistor $N_B$ and pull-up component $P_B$ based on the levels (e.g., voltage levels) of the signals on select lines $SEL_2$ and $SEL_4$.

The arrangement of gating circuit 226 (e.g., transistors $N_1$, $N_2$, $N_3$, $N_4$) and selector 245 (e.g., logic gates $212_A$ and $212_B$, and transistors $N_A$ and $N_B$), as shown in FIG. 2, may form an encoded data line (e.g., column) multiplexer (e.g., a 2:1 MUX followed by another 2:1 MUX). This encoded data line-multiplexer combined with data line decoder 225 allows memory device 200 to selectively form a circuit path between one data lines $BL_1$ through $BL_4$ and a node $211_{A/B}$ (e.g., an output evaluation node) during a read operation.

Output circuit 255 can operate to generate output information OUT based on the value of the voltage at node $211_{A/B}$. The value of information stored in the selected memory cell can be determined (e.g., identified) based on the value of output information OUT. As shown in FIG. 2, output circuit 255 can include a keeper 232, a pull-up component P5 (e.g., primary pull-up component), and a logic gate (e.g., logic NAND gate) 234. Keeper 232 can include transistors (e.g., PMOS transistors) P1 through P4 and an inverter INV. Transistors P1 through P4 can be coupled in series (e.g., arranged in a stack (e.g., stacked transistors)) between node $211_{A/B}$ and supply node 298. The gate terminals of transistors P1 and P2 can be coupled to the output (e.g., output node) of inverter INV. The input (e.g., input node) of inverter INV can be coupled to node $211_{A/B}$. The gate terminals of transistors P3 and P4 can be coupled to a signal (e.g., ground), such that transistors P3 and P4 are turned on and remained turned on during operations (e.g., read operations) of memory device 200.

Pull-up component P5 can include a p-channel transistor (e.g., PMOS transistor) that can be controlled (e.g., turned on or turned off) by a signal (e.g., precharge signal) PreCh. During a read operation, pull-up component P5 can respond to signal PreCh and turn on in order to form a circuit path between node $211_{A/B}$ and supply node 298 to charge (e.g., precharge) node $211_{A/B}$ to a voltage (e.g., voltage V1). Then pull-up component P5 turn can be turned off (to decouple node $211_{A/B}$ from supply node 298) after the voltage at node $211_{A/B}$ reaches a certain value (e.g., the value of voltage V1). FIG. 2 shows pull-up component P5 including a signal transistor coupled between node $211_{A/B}$ and supply node 298 as an example. Pull-up component P5 may include a circuit element (or circuit elements) different from a single transistor as long as a circuit path can be selectively formed (or not be formed) between node $211_{A/B}$ and supply node 298 during a read operation of retrieving information from a selected memory cell of memory array 205.

During a read operation, keeper 232 can operate to keep (e.g., or to cause) the value of voltage at node $211_{A/B}$ to be based on the value of information stored in a selected memory cell. For example, if the information stored in a selected memory cell has one value (e.g., binary 0), keeper 232 may be turned on (or remain turned on), thereby causing the voltage at node $211_{A/B}$ to have one value (e.g., value equal to or approximately equal to the value of voltage V1 at supply node 298) that reflects a value (e.g., binary 0) of information stored in a selected memory cell. If the information stored in a selected memory cell has another value (e.g., binary 1), keeper 232 may be turned off (or remain turned off), thereby causing the value of the voltage at node $211_{A/B}$ to have another value (e.g., close to zero volts or zero volts (e.g., ground potential)) that reflects another value (e.g., binary 1) of information stored in a selected memory cell.

Inverter INV may cause keeper 232 to turn on or turn off based on the value of the voltage at node $211_{A/B}$. In a read operation, keeper 232 may be turned on (or remain turned on) by inverter INV if the voltage at node $211_{A/B}$ is maintained at a value (e.g., the value of voltage V1) that causes inverter INV to cause transistors P1 and P2 to turn on (or remain turned on), thereby causing keeper 232 to turn on (or remain turned on). Keeper 232 may be turned off (or remain turned off) by inverter INV if the voltage at node $211_{A/B}$ has a trigger value (e.g., 0V or close to 0V) that causes inverter INV to turn off transistors P1 and P2, thereby causing keeper 232 to turn off (or remain turned off).

The trigger value of the voltage at node $211_{A/B}$ that causes inverter INV to turn on or turn off the keeper 232 is based on the value of information stored in a selected memory cell. For example, if the value of information stored in a selected memory cell is binary 1, then node $211_{A/B}$ may discharge to ground through a circuit path that includes one of transistors $N_A$ and $N_B$, one of transistors $N_1$, $N_2$, $N_3$, and $N_4$, the selected data line, and a transistor of the selected memory cell. Sometime after node $211_{A/B}$ is discharged, the value of the voltage at node $211_{A/B}$ may reach a value of 0V or close to 0V (e.g., trigger value), thereby creating a trigger event that turns off keeper 232. In another example, if the value of information stored in a selected memory cell is binary 0, then node $211_{A/B}$ may not discharge to ground. The value of the voltage at node $211_{A/B}$ may remain at a value that may be equal to or approximately equal to the value of voltage V1 at supply node 298. This causes inverter INV to turn on keeper 232 or causes keeper 232 to remain turned on.

Logic gate 234 can generate output information OUT at its output based on the voltages at nodes $211_{A/B}$ and 220. Memory device 200 can generate output information similar to, or identical to, output information $OUT_1$ through $OUT_N$ of FIG. 1. For simplicity, only one of the output information (e.g., OUT) of memory device 200 is shown in FIG. 2.

Memory device 200 may include a memory portion (e.g., circuitry) 275 coupled to node 220. During a read operation, node 220 can be provided with a voltage, such that the value of output information OUT may be based on only the value of the voltage at node $211_{A/B}$. For example, during a read operation, node 220 can be provided with a voltage having a value (e.g., binary 1) independent of (e.g., regardless of) the value of information stored in a selected memory cell. In this example, during a read operation, memory portion 275 may operate to form a circuit path between node 220 and node 298, such that the voltage at node 220 can have a value based the value of voltage V1 at node 298. In some arrangements, memory portion 275 can include a portion of memory device 200 that is similar to the portion of memory device 200 shown in FIG. 2, such that node 220 can be similar to node $211_{A/B}$. In such arrangements, memory portion 275 can include a "mirror" of the portion of memory device 200 shown in FIG. 2. For example, except for logic gate 234, memory portion 275 can include a structure (e.g., mirrored copy) of the portion of memory device 200 shown in FIG. 2.

In FIG. 2, based on address information A1 through A7 during a read operation, memory device 200 can select a particular memory cell (or memory cells) among the memory cells of memory array 205 to retrieve information from that particular memory cell (selected memory cell). A selected memory cell refers to a particular memory cell among the memory cells of memory array 205 that memory device 200 selects to retrieve information from that particular memory cell. Memory cells that are not selected to retrieve information from are referred to as unselected memory cells. During a read operation, memory device 200 may retrieve information from many selected memory cells of memory array 205. Memory device 200 may access the selected memory cells one at a time based on address information A1 through A7.

During a read operation, address information A1 through A5 can be provided with a value (e.g., a combination of binary 0 and 1 values) corresponding to a portion (e.g., row address portion) of the address of a selected memory (or memory cells). Address information A6 and A7 can be provided with a value (e.g., a combination of binary 0 and 1 values) corresponding to another portion (e.g., column address portion) of the address of the selected memory or memory cells.

Access line decoder 215 can decode the value of address information A1 through A5 during a read operation to determine which of access lines $WL_1$ through $WL_{32}$ (coupled to respective outputs (e.g., output nodes 1 through 32) of access line decoder 215) is to be selected (e.g., activated) in order to access a selected memory cell (or selected memory cells). FIG. 2 shows an example where access line decoder 215 receives address information having a combination of five bits (e.g., row address bits A1 through A5) to select any of the $2^5=32$ access lines $WL_1$ through $WL_{32}$. However, access line decoder 215 may receive address information having a number of bits (e.g., R bits where R is an integer) different from five, depending on the number (e.g., $2^R$) of access lines included in memory device 200. For example, if the portion of the memory device 200 shown in FIG. 2 has 64 (which is $2^6$) access lines (e.g., $WL_1$ through $WL_{64}$) instead of the example 32 access lines, then access line decoder 215 may receive address information having a combination of at least six bits in order to select any of the 64 access lines. In another example, if the portion of the memory device 200 shown in FIG. 2 has 128 (which is $2^7$) access lines (e.g., $WL_1$ through $WL_{128}$), then access line decoder 215 may receive address information having a combination of at least seven bits in order to select any of the 128 access lines.

Data line decoder 225 can operate to decode the value of address information A6 and A7 during a read operation to determine which of select lines $SEL_1$ through $SEL_4$ is to be selected (e.g., activated) in order to turn on one of transistors $N_1$, $N_2$, $N_3$, and $N_4$. Only one of select lines $SEL_1$ through $SEL_4$ can be selected at a time. Thus, during a read operation, only one of transistors $N_1$, $N_2$, $N_3$, and $N_4$ can be turned on at a time. This allows gating circuit 226 to form a circuit path between a data line (e.g., selected data line) associated with the selected memory cell and one of nodes $210_A$ and $210_B$ through one of transistors $N_1$, $N_2$, $N_3$, and $N_4$ that is turned on.

FIG. 2 shows an example where data line decoder 225 receives address information having a combination of two bits (e.g., column address bits A6 and A7) to select any of (four) select lines $SEL_1$ through $SEL_4$ in order to turn on one of (four) transistors $N_1$, $N_2$, $N_3$, and $N_4$ and select a data line among data lines $BL_1$ through $BL_4$. However, data line decoder 225 may receive address information having a number of bits (e.g., C bits where C is an integer) different from two, depending on the number (which is $2^C$) of data lines included in memory device 200. For example, if the portion of the memory device 200 shown in FIG. 2 has eight (which is $2^3$) data lines (e.g., $BL_1$ through $BL_8$) instead of the example four data lines ($BL_1$ through $BL_4$), and eight corresponding transistors (e.g., $N_1$ through $N_8$) instead of the example four transistors ($N_1$ through $N_4$), then data line decoder 225 may receive address information having a combination of three bits in order to turn on any of the eight transistors to select one of the eight data lines. In another example, if the portion of the memory device 200 shown in FIG. 2 has 16 (which is $2^4$) data lines (e.g., $BL_1$ through $BL_{16}$) and 16 corresponding transistors (e.g., $N_1$ through $N_{16}$), then data line decoder 225 may receive address information having a combination of four bits in order to turn on any of the 16 transistors to select one of the 16 data lines.

Each of access lines $WL_1$ through $WL_{32}$ and each of access select lines $SEL_1$ through $SEL_4$ can conduct (e.g., can be provided with) a signal. The signal can have different levels (e.g., voltage levels) that may include a lower level and a higher level. The lower level of the signal may include zero volts (0V) or alternatively a level equivalent to binary 0. The higher level of the signal may include voltage V1 (e.g., Vcc or Vdd) or alternatively a level equivalent to binary 1. When a particular line (e.g., one of $WL_1$ through $WL_{32}$ or one of $SEL_1$ through $SEL_4$) is selected, memory device 200 may cause the level of the signal on that particular line to change from one level to another level that is different from the levels of the signals of unselected lines. For example if access line $WL_{32}$ is selected during a read operation, then memory device 200 may cause the level of the signal on access line $WL_2$ to change from a lower to a higher level and may cause the levels of the signals on other access lines (e.g., unselected $WL_1$ through $WL_{31}$) to remain at a lower level (or to change from a higher level to a lower level). In another example, if select line $SEL_2$ is selected during a read operation, then memory device 200 may cause the level of the signal on select line $SEL_2$ to change from a lower to a higher level and may cause the levels of the signals on other select lines (e.g., unselected select lines $SEL_1$, $SEL_3$, and $SEL_4$) to remain at a lower level (or to change from a higher level to a lower level).

During a read operation, the level of the signal on the selected line can cause one of transistors $N_1$, $N_2$, $N_3$, and $N_4$ (the transistor controlled by the selected select line) to turn on while the levels of the signals on other select lines (e.g., unselected select lines) can cause other transistors among transistors $N_1$, $N_2$, $N_3$, and $N_4$ to turn off (or remain turned off). The transistor that is turned on (one of transistors $N_1$, $N_2$, $N_3$, and $N_4$) can form a circuit path between the data line (one of date lines $BL_1$ through $BL_4$) associated with the selected memory cell and either node $210_A$ or node $210_B$. The data line associated with a selected memory cell (which is the data line coupled to one of transistors $N_1$, $N_2$, $N_3$, and $N_4$ that is turned on) can be referred to as a selected data line. Data lines associated with unselected memory cells can be referred to as unselected data lines.

During a read operation, only one of transistors $N_A$ and $N_B$ can be turned on at a time to form a circuit path between node $211_{A/B}$ and one of nodes $210_A$ and $210_B$. This may form (e.g., complete) a circuit path between node $211_{A/B}$ and one data lines $BL_1$ through $BL_4$. For example, if select line $SEL_1$ or $SEL_2$ is selected, logic gate $212_A$ turns on transistor $N_A$, and logic gate $212_B$ turns off transistor $N_B$. This forms either a circuit path between node $211_{A/B}$ and data line $BL_1$ (through transistors $N_A$ and $N_1$) if select line $SEL_1$ is selected or a circuit path between node $211_{A/B}$ and data line $BL_2$ (through transistors $N_A$ and $N_2$) if select line $SEL_2$ is selected. In another example, if select line $SEL_3$ or $SEL_4$ is selected, logic gate $212_B$ turns on transistor $N_B$ and logic gate $212_A$ turns off transistor $N_A$. This forms either a circuit path between node $211_{A/B}$ and data line $BL_3$ (through transistors $N_B$ and $N_3$) if select line $SEL_3$ is selected or a circuit path between node $211_{A/B}$ and data line $BL_4$ (through transistors $N_B$ and $N_4$) if select line $SEL_4$ is selected.

During a read operation, only one of pull-up components $P_A$ and $P_B$ is turned off while the other one is turned on. The turned off pull-up component (either $P_A$ or $P_B$) is the one coupled to the selected data line. For example, if select line $SEL_1$ or $SEL_2$ is selected, logic gate $212_A$ turns off pull-up component $P_A$, thereby decoupling node $210_A$ from supply node 298. In this example, logic gate $212_B$ turns on pull-up component $P_B$, thereby forming a circuit path between node $210_B$ and supply node 298 (through pull-up component $P_B$). In another example, if select line $SEL_3$ or $SEL_4$ is selected, logic gate $212_B$ turns off pull-up component $P_B$, thereby decoupling node $210_B$ from supply node 298. In this example, logic gate $212_A$ turns on pull-up component $P_A$, thereby forming a circuit path between node $210_A$ and supply node 298 (through pull-up component $P_A$).

The following example describes an example where memory cell $202_{32}$ is assumed to be a selected memory cell at a particular time during an example read operation. As shown in FIG. 2, memory cell $202_{32}$ (the selected memory cell) is associated with access line $WL_{32}$ and data line $BL_2$. Thus, address information A1, A2, A3, A4, and A5 may be provided with a value (e.g., a combination of binary 0 and 1 values) to cause access line decoder 215 to select access line $WL_{32}$. Address information A6 and A7 may be provided with a value (e.g., a combination of binary 0 and 1 values) to cause data line decoder 225 to select line $SEL_2$ in order to turn on transistor $N_2$ coupled to the data line. This forms a circuit path between data line $BL_2$ and node $210_A$ through transistor $N_2$ (which is turned on).

In this example, data line decoder 225 does not select the select lines $SEL_1$, $SEL_3$, and $SEL_4$. Thus, transistors $N_1$, $N_3$, and $N_4$ are turned off. Therefore, no circuit paths may be formed between data line $BL_1$ and node $210_A$, between data line $BL_3$ and node $210_B$, and between data line $BL_4$ and node $210_B$.

Since select line $SEL_2$ is selected, one of the inputs of logic gate $212_A$ (the input coupled to select line $SEL_2$) is provided with a higher level (e.g., V1). This causes logic gate $212_A$ to turn on transistor $N_A$. Thus, a circuit path is formed between node $210_A$ and node $211_{A/B}$ through transistor $N_A$. Since data line $BL_2$ is coupled to node $210_A$ through transistor $N_2$ (which is turned on by select line $SEL_2$), a circuit path is formed between data line $BL_2$ and node $211_{A/B}$ (through transistors $N_2$ and $N_A$).

Since select lines $SEL_3$ and $SEL_4$ are unselected, the inputs of logic gate $212_B$ coupled to (unselected) select lines $SEL_3$ and $SEL_4$ are provided with a lower level (e.g., 0V). This causes logic gate $212_B$ to turn off transistor $N_B$. Therefore, a circuit path may not be formed between data line $BL_3$ and node $211_{A/B}$ and a circuit path may not be formed between data line $BL_4$ and node $211_{A/B}$.

In the example read operation, since one of the inputs of logic gate $212_A$ is coupled to line $SEL_2$ (selected select line in this example) having a higher level, logic gate $212_A$ turns off pull-up component $P_A$. Thus, node $210_A$ is decoupled from (e.g., is not coupled to) node 298. Since both inputs of logic gate $212_B$ are coupled to select lines $SEL_3$ and $SEL_4$ (unselected select lines in this example), logic gate $212_B$ turns on pull-up component $P_B$. Thus, node $210_B$ is coupled to node 298 through a circuit path through pull-up component $P_B$.

In a read operation, such as the example read operation described above, pull-up device P5 can be turned on and turn off at appropriate times, by providing signal PreCh with lower level (e.g., 0V) and a higher level (e.g., V1), respectively, at appropriate times. For example, in the example above, select line $SEL_2$ is activated based on address information A6 and A7. Then, pull-up component P5 is turned on; it charges node $211_{A/B}$, node $210_A$, and data line $BL_2$ to V1−Vt (e.g., Vcc−Vt). Finally, access line $WL_{32}$ is activated just after pull-up component P5 is turned off (e.g., "just-in-time precharge" technique).

After pull-up component P5 is turned off, keeper 232 can operate to keep (e.g., to cause) the value of the voltage at node $211_{A/B}$ to be based on (e.g., to correspond to) the value (e.g., binary 0 or 1) of the information stored in memory cell $202_{32}$ (selected memory cell in the above example). For example, if the information stored in memory cell $202_{32}$ (selected memory cell) has a value of binary 0, keeper 232 may be turned on (or remain turned on), thereby causing the voltage at node $211_{A/B}$ to have a value equal to or approximately equal to the value of voltage V1 at supply node 298. If the information stored in memory cell $202_{32}$ has value of binary 1, keeper 232 may be turned off (or remain turned off), thereby causing the value of the voltage at node $211_{A/B}$ to have a value close to zero volts or zero volts.

Based on the value of the voltage at node $211_{A/B}$, logic gate 234 can operate to generate output information OUT having a value (e.g., binary 0 or 1) that indicates the value of the information stored in memory cell $202_{32}$.

The example above assumes memory cell $202_{32}$ is a selected memory cell during a read operation. Other memory cells of memory array 205 can be selected during a read operation, and operations of gating circuit 226, selector 245, and output circuit 255 can be similar to those described above.

The arrangement of the encoded data line-multiplexer (e.g., formed by gating circuit 226 and selector 245) of memory device 200 may improve loading at node $211_{A/B}$. For example, as shown in FIG. 2, the arrangement of selector 245 allows nodes $210_A$ and $210_B$ to be separated from (e.g., not directly coupled to) node $211_{A/B}$. And, as described above, only one of nodes $210_A$ and $210_B$ is coupled to node $211_{A/B}$ (through one of transistor $N_A$ and $N_B$) during a read operation to retrieve information stored in a selected memory cell. Thus, in a read operation, the load at node $211_{A/B}$ is reduced in comparison with some conventional ROM devices where nodes $211_{A/B}$ may be merged with (e.g., directly coupled to) multiple data line paths.

The arrangement of selector 245 in memory device 200 may also improve the speed (e.g., may allow a faster data line evaluation) while maintaining noise-tolerance (e.g., noise immunity) during a read operation. For example, some conventional ROM devices may include transistors (e.g., column select transistors) to select data lines during a read operation. Such transistors may be fabricated with a relatively higher threshold voltage (Vt) in order to minimize any leakage current that may occur (e.g., occurs through unselected data lines). In FIG. 2, the arrangement of selector 245 (e.g., pull-up components $P_A$ and $P_B$) may allow transistors $N_1$, $N_2$, $N_3$, and $N_4$ to be fabricated with a relatively lower (e.g., nominal) threshold voltage (Vt) to improve operation of memory device 200, as described below.

As shown in FIG. 2, selector 245 includes pull-up components $P_A$ and $P_B$, which can have a relatively small size (e.g., minimum PMOS transistor size). As described above, the pull-up component ($P_A$ or $P_B$) associated with unselected data lines (some of $BL_1$ through $BL_4$) can be turned on. The turned on pull-up component ($P_A$ or $P_B$) couples node $210_A$ or node $210_B$ (whichever node is associated with the unselected data lines) to node 298. Therefore, in memory device 200, any leakage current that may occurs through unselected data lines may be provided (e.g., locally provided) by the pull-up component ($P_A$ or $P_B$), whichever is turned on) associated with the unselected data lines. The inclusion of a pull-up component ($P_A$ or $P_B$) at each of nodes $210_A$ and $210_B$ allows transistors $N_1$, $N_2$, $N_3$, and $N_4$ to be fabricated with a relatively lower threshold voltage (Vt) because any leakage current that may occur through unselected data lines may be provided by pull-up component $P_A$ or $P_B$. A lower threshold voltage in transistors $N_1$, $N_2$, $N_3$, and $N_4$ may improve the speed of a read operation in memory device 200 and may maintain the noise-tolerance (e.g., without degrading noise-tolerance) during the read operation.

Moreover, keeper 232 of memory device 200 may have a relatively smaller size in comparison with similar component in some conventional ROM devices. Regarding the leakage current that may occur through unselected data lines during a read operation as described above, in some conventional ROM devices, a component similar to keeper 232 may provide such a leakage current. In memory device 200, as described above, any leakage current that may occur through unselected data lines can be provided by pull-up component $P_A$ or $P_B$ instead of provided by keeper 232. Thus, keeper 232 may be fabricated with a relatively smaller size. This may improve (e.g., reduce) contention between keeper 232 and the selected memory cell and improve read-delay (e.g., output information OUT may be generated relatively earlier) during a read operation.

Other memory devices described below with reference to FIG. 4 through FIG. 10 may also have improvements similar to those of memory device 200.

FIG. 3A and FIG. 3B show schematic diagrams of example structures of the memory cells of memory device 200 of FIG. 2, according to some embodiments described herein. As shown in FIG. 3A and FIG. 3B, each of the memory cells can include a single transistor (e.g., only one transistor that constitutes a memory cell). Each of the memory cells can store information that may represent a single bit (e.g., only one bit) of information. The value of information stored in a memory cell can have a value of either binary 0 (shown as "0" in FIG. 3A and FIG. 3B) or binary 1 (shown as "1" in FIG. 3A and FIG. 3B). Differences in the structures of the memory cells in FIG. 3A and FIG. 3B are described below.

As shown in FIG. 3A, memory device 200 can include connections (e.g., electrically conductive segments) 303. Conductive connections 303 may be formed by selectively connecting (e.g., through conductive vias) the terminals (e.g., the drains) of the transistors of some of the memory cells to corresponding data lines $BL_1$ through $BL_4$. At a particular memory cell, the presence or absence of one of connections 303 may indicate the value of information stored in that particular memory cell. For example, memory cells $201_1$, $202_1$, $202_{32}$, $203_{32}$, and $204_1$ may have connections 303 coupled to the corresponding data lines, indicating that the value of information stored in each of $201_1$, $202_1$, $203_{32}$, and $204_1$ has a value of "1" (binary 1). Memory cells $201_{32}$, $203_1$, and $204_{32}$ may have no connections 303 coupled to data lines $BL_1$ through $BL_4$, indicating that the value of information stored in each of $201_{32}$, $203_1$, and $204_{32}$ has a value of "0" (binary 0).

In FIG. 3B, each of the memory cells may be coupled to a corresponding data line (e.g., one of data lines $BL_1$ through $BL_4$). The value (e.g., "0" or "1") of information stored at a particular memory cell can be indicated by the value of the threshold voltage (e.g., Vt0 or Vt1) of that particular memory cell. FIG. 3B shows different threshold voltages Vt0 or Vt1 having different values that represent different values of information stored in the memory cells. For example, each of memory cells $201_1$, $202_1$, $202_{32}$, $203_{32}$, and $204_1$ may have threshold voltage Vt1, indicating that information stored in each of $201_1$, $202_1$, $202_{32}$, $203_{32}$, and $204_1$ has a value of "1". Each of memory cells $201_{32}$, $203_1$, and $204_{32}$ may have threshold voltage Vt0, indicating that information stored in each of $201_{32}$, $203_1$, and $204_{32}$ has a value of "0".

The value of information stored in the memory cells of memory device 200 in FIG. 3A and FIG. 3B may be fixed (e.g., may not be updated) after the information is stored in the memory cells. Thus, the memory cells in FIG. 3A and FIG. 3B may be programmed only one time (e.g., one-time programmable memory cells).

Figure 4:
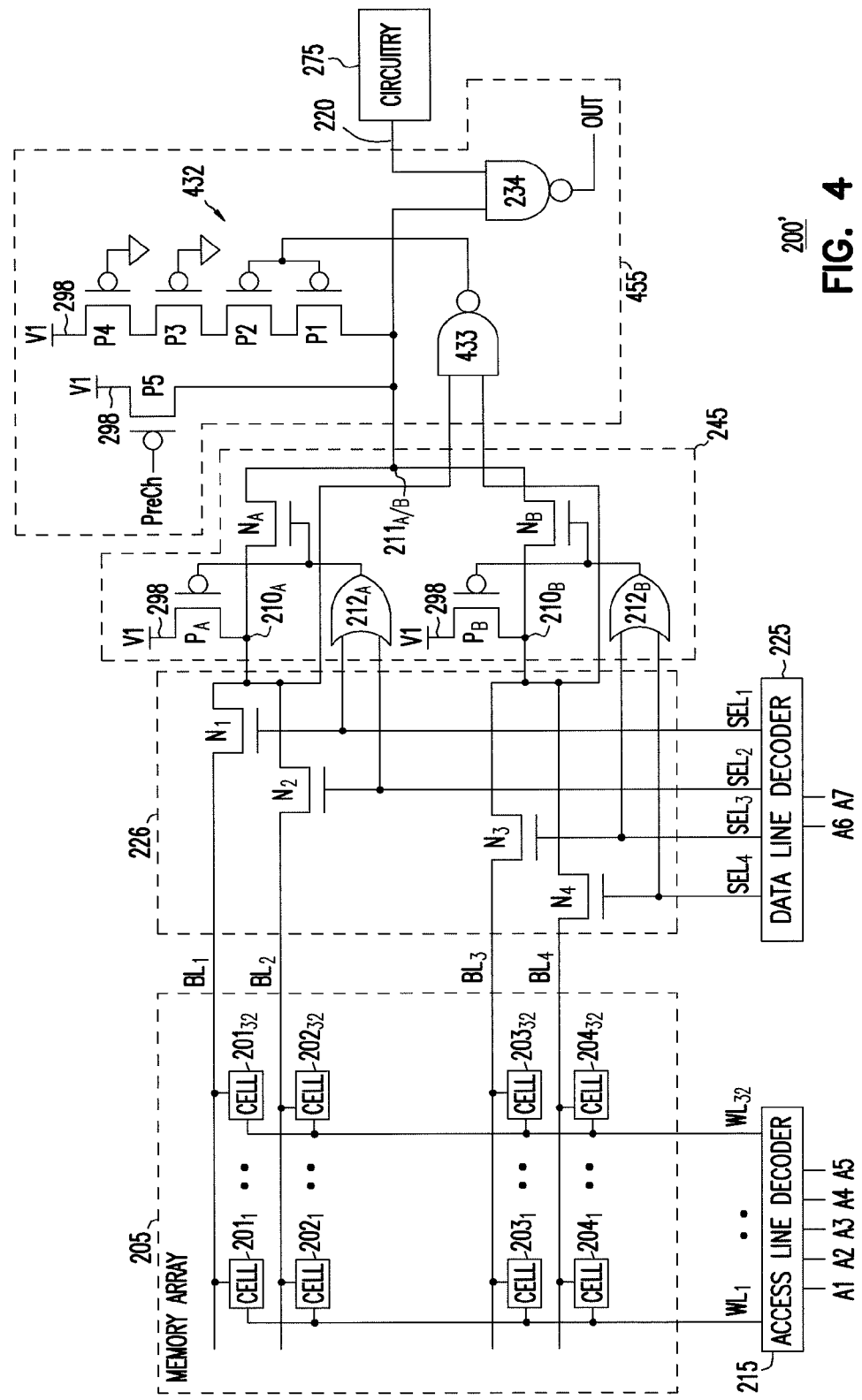
FIG. 4 shows a memory device that can be a variation of the memory device of FIG. 2, according to some embodiments described herein.

FIG. 4 shows a memory device 200' that can be a variation of memory device 200 of FIG. 2, according to some embodiments described herein. Memory device 200' can include elements similar to, or identical to, those of memory device 200 (FIG. 2). For simplicity, similar or identical elements between memory devices 200 and 200' are given the same labels. The description of such similar or identical elements is not repeated in the description of FIG. 4.

Memory device 200' can include memory array 205, access line decoder 215, data line decoder 225, gating circuit 226, selector 245, and output circuit 455 including keeper 432. Keeper 432 can include transistors P1, P2, P3, and P4 and logic gate 433 (e.g., multi-input logic NAND gate). The gate terminals of transistor P1 and P2 are coupled to the output of logic gate 433. The inputs of logic gate 433 are coupled to nodes $201_A$ and $210_B$. The function of keeper 432 is similar to the function of keeper 232 (FIG. 2). For example, during a read operation, keeper 432 can operate to keep (e.g., or to cause) value of voltage at node $211_{A/B}$ to be based on the value of information stored in a selected memory.

Differences between memory devices 200 and 200' include differences in the structures of keepers 232 and 432. In FIG. 4, logic gate 433 controls the switching (e.g., turn on or turn off) of keeper 432. In FIG. 2, inverter INV controls the switching of keeper 232. For example, in FIG. 2, keeper 232 may be turned off by inverter INV when the voltage at node $211_{A/B}$ has a trigger value (e.g., 0V or close to 0V) that causes inverter INV to turn off transistors P1 and P2, thereby turning off keeper 232. The trigger value of the voltage at node $211_{A/B}$ that causes keeper 232 to turn off is based on the value of information stored in a selected memory cell. For example, in FIG. 2, if memory cell $202_{32}$ is the selected memory cell and the value of information stored in the selected memory cell (e.g., $202_{32}$) is binary 1, then node $211_{A/B}$ may discharge to ground through the circuit path formed by a circuit path that includes transistors $N_2$ and $N_A$, data line $BL_2$, and the transistor of memory cell $202_{32}$. Sometime after node $211_{A/B}$ is discharged, the value of the voltage at node $211_{A/B}$ may reach a value of 0V or close to 0V (e.g., trigger value) thereby creating a trigger event that turns off keeper 232.

In FIG. 4, keeper 432 is controlled by logic gate 433 based on the voltages at nodes $210_A$ and $210_B$. For example, logic gate 433 can turn off keeper 432 based on the values of the voltages at node $210_A$ or $210_B$ (e.g., earlier data line evaluation voltage) instead of the value of the voltage at node $211_{A/B}$ (e.g., post-column-MUX node ($211_{A/B}$) coupled to the selected data line). Thus, in an example read operation, if memory cell $202_{32}$ is the selected memory cell and information stored in the memory cell is binary 1, a node $210_A$ may discharge to ground through a circuit path that includes transistors $N_2$ and $N_A$, data line $BL_2$, and the transistor of memory cell $202_{32}$. In this example, node $210_A$ may reach the trigger value (e.g., 0V or close to 0V) earlier than node $211_{A/B}$. Thus, in comparison with keeper 232 of FIG. 2, keeper 432 of FIG. 4 may be turned off by logic gate 433 earlier than keeper 232 (FIG. 2) being turned off by inverter INV of FIG. 2.

In comparison with memory device 200 or with some conventional ROM devices, turning off keeper 432 of memory device 200' earlier, as described above, may reduce or mitigate contention between keeper 432 and the selected memory cell and further improve the read-delay (e.g., process variation delay) during a read operation. This may also allow memory device 200' to operate at a minimum operating voltage (e.g., Vmin) having a lower value than the value of a minimum operating voltage of some conventional ROM memory devices. In some arrangements, memory device 200' may share the same supply voltage (e.g., voltage V1) with other components (e.g., logic core, such as processing core in a processor). Lower minimum operating voltage of memory device 200' may allow flexibility in voltage scaling of such components.

In addition to the improvements described here with reference to FIG. 4, memory device 200' also has other improvements associated with memory device 200, such as those described above with reference to FIG. 2.

Figure 5:
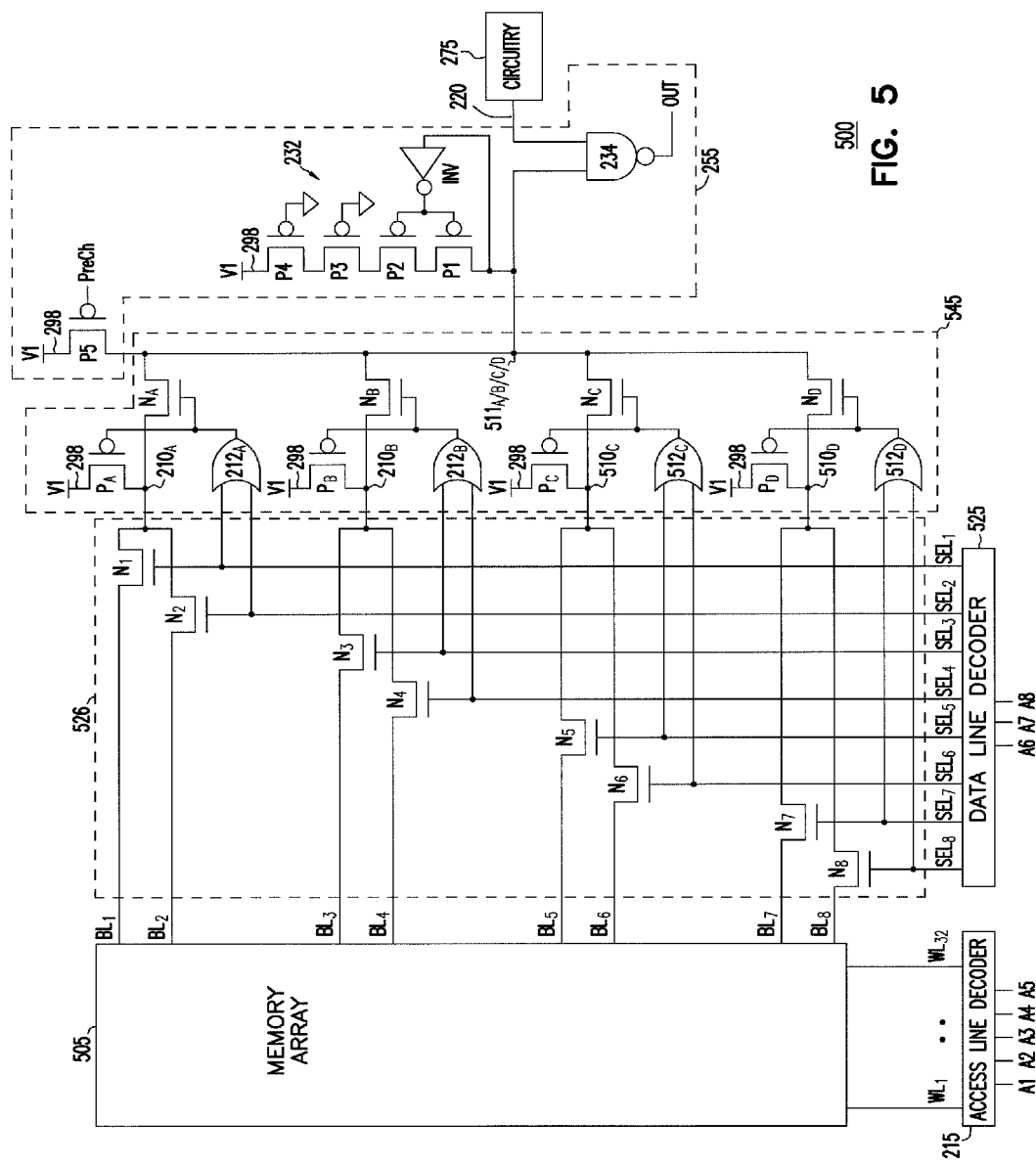
FIG. 5 shows a memory device including memory device including another data line-multiplexer, according to some embodiments described herein.

FIG. 5 shows a memory device 500 including another encoded data line-multiplexer that includes selector 545, according to some embodiments described herein. Memory device 500 can include elements similar to, or identical to, those of memory device 200 (FIG. 2). For simplicity, similar or identical elements between memory devices 200 and 500 are given the same labels. The description of such similar or identical elements is not repeated in the description of FIG. 5.

As shown in FIG. 5, memory device 500 can include a memory array 505 (which can include memory cells similar to the memory cells of memory array 205 (FIG. 2), a gating circuit 526, a selector 545, output circuit 255, access line decoder 215, and data line decoder 525. Gating circuit 526 and selector 545 may form an encoded data line-multiplexer of memory device 500.

Differences between memory devices 200 and 500 include the number of data lines and the number of transistors in gating circuit 526 in memory device 500, and the arrangement of selector 545. For example, as shown in FIG. 5, memory device 500 can include eight data lines (e.g., local data lines) $BL_1$ through $BL_8$ and eight select lines $SEL_1$ through $SEL_8$, gating circuit 526 can include eight transistors (e.g., column MUX transistors) $N_1$ through $N_8$ controlled by eight select lines $SEL_1$ through $SEL_8$, respectively. Each of data lines $BL_1$ through $BL_8$ can be associated with a different group of memory cells in memory array 205. Data line decoder 525 that can receive information A6, A7, and A8 (e.g., three column address bits) to select any of eight select lines $SEL_1$ through $SEL_8$ in order to turn on one of eight transistors $N_1$ through $N_8$, thereby forming a circuit path between one of data lines $BL_1$ through $BL_8$ and one of nodes $210_A$, $210_B$, $510_C$, and $510_D$ (e.g., intermediate nodes).

Selector 545 can operate during a read operation to form a circuit path between and a node $511_{A/B/C/D}$ (e.g., an output evaluation node) and one of nodes $210_A$, $210_B$, $510_C$, and 510. This causes the value of the voltage at node $511_{A/B/C/D}$ to be based on the value of information stored in a selected memory cell associated with one of data lines $BL_1$ through $BL_8$. Output circuit 255 can operate to generate output information OUT that has a value (e.g., binary 0 or 1) based on the value of voltage at node $511_{A/B/C/D}$. The value of output information OUT reflects the value of information stored in the selected memory cell associated with the selected data line.

As shown in FIG. 5, selector 545 can include transistors $N_A$, $N_B$, $N_C$, and $N_D$, pull-up components $P_A$, $P_B$, $P_C$, and $P_D$, and gates $212_A$, $212_B$, $512_C$, and $512_D$ to control (e.g., turn on or turn off) corresponding transistors $N_A$, $N_B$, $N_C$, and $N_D$, pull-up components $P_A$, $P_B$, $P_C$, and $P_D$. Logic gate $212_A$ can operate to control transistor $N_A$ and pull-up component $P_A$ based on the levels of the signals on select lines $SEL_1$ and $SEL_2$. Logic gate $212_B$ can operate to control transistor $N_B$ and pull-up component $P_B$ based on the levels of the signals on select lines $SEL_3$ and $SEL_4$. Logic gate $512_C$ can operate to control transistor $N_C$ and pull-up component $P_C$ based on the levels of the signals on select lines $SEL_5$ and $SEL_6$. Logic gate $512_D$ can operate to control transistor $N_D$ and pull-up component $P_D$ based on the levels of the signals on select lines $SEL_7$ and $SEL_8$.

The arrangement of gating circuit 526 (e.g., transistors $N_1$ through $N_8$) and selector 545 (e.g., gates $212_A$, $212_B$, $512_C$, and $512_D$, and transistors $N_A$, $N_B$, $N_C$, and $N_D$), as shown in FIG. 5, may form an encoded data line-multiplexer (e.g., a 2:1 MUX followed by a 4:1 MUX). This encoded data line-multiplexer combined with data line decoder 525 allows memory device 500 to selectively form a circuit path between data lines BL1-8 and node $511_{A/B/C/D}$ during a read operation.

During a read operation, only one of transistors $N_A$, $N_B$, $N_C$, and $N_D$ can be turned on at a time to form a circuit path between node $511_{A/B/C/D}$ and one of data lines BL1-8 associated a selected memory cell. For example, if select line $SEL_5$ or $SEL_6$ is selected, logic gate $512_C$ turns on transistor $N_C$. Logic gates $212_A$, $212_B$, and $512_D$ turn off transistors $N_A$, $N_B$, and $N_D$, respectively. This forms either a circuit path between node $511_{A/B/C/D}$ and data line $BL_5$ (through transistors $N_C$ and $N_5$) if select line $SEL_5$ is selected or a circuit path between node $511_{A/B/C/D}$ and data line $BL_6$ (through transistors $N_C$ and $N_6$) if select line $SEL_6$ is selected. In another example, if select line $SEL_7$ or $SEL_8$ is selected, logic gate $512_D$ turns on transistor $N_D$ and gates $212_A$, $212_B$, and $512_C$ turn off transistor $N_A$, $N_B$, and $N_C$, respectively. This forms either a circuit path between node $511_{A/B/C/D}$ and data line $BL_7$ (through transistors $N_D$ and $N_7$) if select line $SEL_7$ is selected or a circuit path between node $511_{A/B/C/D}$ and data line $BL_8$ (through transistors $N_D$ and $N_8$) if select line $SEL_8$ is selected.

During a read operation, the pull-up component (e.g., one of $P_A$, $P_B$, $P_C$, and $P_D$) associated with the selected data line (one of $BL_1$ through $BL_8$) can be turned off, and the pull-up components associated with unselected data lines can be turned on. For example, if select line $SEL_5$ or $SEL_6$ is selected, logic gate $512_C$ can turn off pull-up component $P_C$ and gates $212_A$, $212_B$, and $512_D$ can turn on pull-up components $P_A$, $P_B$, and $P_D$. Thus, in this example, node $510_C$ is not coupled to (e.g., is decoupled from) node 298 because pull-up component $P_C$ is turned off. Nodes $210_A$, $210_B$, and $510_D$ are coupled to nodes 298 through pull-up components $P_A$, $P_B$, and $P_D$, respectively, thereby forming a circuit path between supply node 298 and each of nodes $210_A$, $210_B$, and 510. In another example, if select line $SEL_7$ or $SEL_8$ is selected, logic gate $512_D$ can turn off pull-up component $P_D$ and gates $212_A$, $212_B$, and $512_C$ can turn on pull-up components $P_A$, $P_B$, and $P_C$. Thus, in this example, node $510_D$ is not coupled to (e.g., is decoupled from) node 298 because pull-up component $P_D$ is turned off. Nodes $210_A$, $210_B$, and $510_C$ are coupled to nodes 298 through pull-up components $P_A$, $P_B$, and $P_D$, respectively, thereby forming a circuit path between supply node 298 and each of nodes $210_A$, $210_B$, and $510_C$.

Selector 545 can improve operations of memory device 500 in ways similar to selector 245 of memory device 200. For example, in memory device 500, nodes $210_A$, $210_B$, $510_C$, and $510_D$ are separated from (e.g., not directly coupled to) node $511_{A/BC/D}$, and only one of transistors $N_1$ through $N_8$ and only one of transistors $N_A$, $N_B$, $N_C$, and $N_D$ are turned on during reading of a selected memory. Thus, only one of nodes $210_A$, $212_B$, $512_C$, and $512_D$ is coupled to node $511_{A/B/C/D}$ during reading of a selected memory. This may improve (e.g., reduce) the loading at node $511_{A/B/C/D}$. Further, in memory device 500, each of nodes $210_A$, $210_B$, $510_C$, and $510_D$ can be locally coupled to a pull-up component (one of $P_A$, $P_B$, $P_C$, and $P_D$). This allows transistors $N_1$ through $N_8$ to be fabricated with a relatively lower threshold voltage (Vt). Thus, during a read operation, the speed of reading a selected memory cell may be improved while noise-tolerance may be maintained. Moreover, as in the memory device 200 (FIG. 2), contention between keeper 232 and the selected memory cell and read-delay during a read operation may also be improved.

Figure 6:
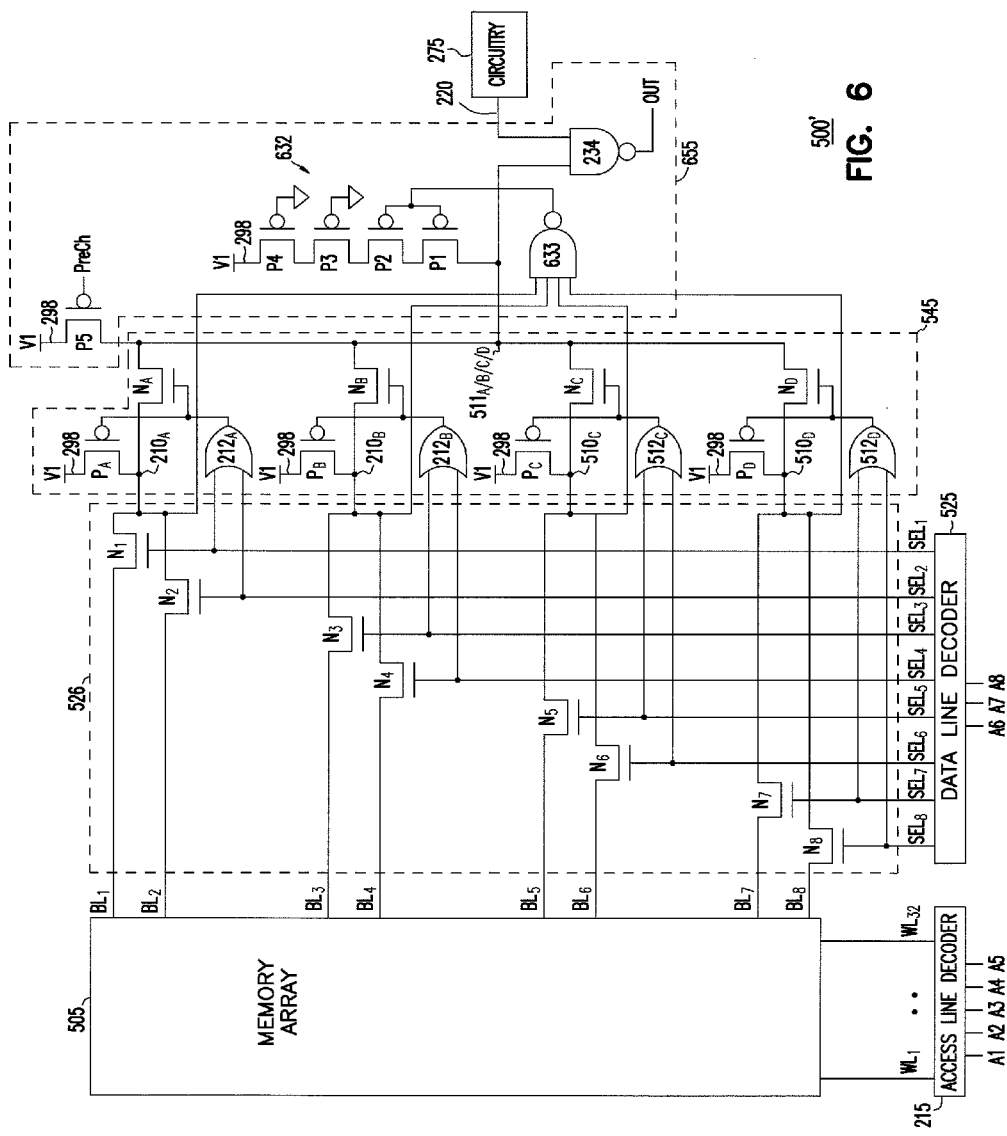
FIG. 6 shows a memory device that can be a variation of the memory device of FIG. 5, according to some embodiments described herein.

FIG. 6 shows a memory device 500', which can be a variation of memory device 500 of FIG. 5, according to some embodiments described herein. Memory device 500' can include elements similar to, or identical to, those of memory device 500 (FIG. 5). For simplicity, similar or identical elements between memory devices 500 and 500' are given the same labels. Description of such similar or identical elements is not repeated in the description of FIG. 6.

Memory device 500' can include memory array 505, access line decoder 215, data line decoder 525, gating circuit 526, selector 545, and output circuit 255 including keeper 632. Keeper 632 can include transistors P1, P2, P3, and P4 and logic gate 633 (e.g., multi-input logic NAND gate). The gate terminals of transistor P1 and P2 are coupled to the output of logic gate 633. The inputs of logic gate 633 are coupled to nodes $201_A$, $210_B$, $510_C$, and $510_D$. The function of keeper 632 is similar to the function of keeper 232 (FIG. 2). For example, during a read operation, keeper 632 can operate to keep (e.g., or to cause) value of voltage at node $511_{A/B/C/D}$ to be based on the value of information stored in a selected memory.

Differences between memory devices 500 and 500' include differences in the structures of keepers 232 and 632. In FIG. 5, inverter INV controls the switching of (e.g., turn on or turn off) keeper 232 based on the value of the voltage at node $511_{A/B/C/D}$. In FIG. 6, logic gate 633 controls the switching of (e.g., turn on or turn off) keeper 632. For example, in FIG. 6, keeper 632 can be turned off by logic gate 633 based on the value of the voltage at nodes $210_A$, $210_B$, $510_C$, and $510_D$ instead of the value of the voltage at node $511_{A/B/C/D}$. Thus, keeper 632 of FIG. 6 may be turned off by logic gate 633 earlier than keeper 232 (FIG. 5) being turned off by inverter INV of FIG. 5.

In comparison with memory device 500 (FIG. 5) or with some conventional ROM devices, turning off keeper 632 of memory device 500' earlier, as described above, may further improve (e.g., mitigate) contention between keeper 632 (FIG. 6) and the selected memory cell and further improve the read-delay during a read operation. In addition to having improvements similar to memory device 500, memory device 500' may also have an improved minimum operating voltage (e.g., Vmin) in comparison with some conventional ROM memory devices. For example, in comparison with some conventional ROM memory devices, memory device 500' may operate at a minimum operating voltage (e.g., Vmin) having a relatively lower value and a better noise immunity (e.g., 4% better).

Figure 7:
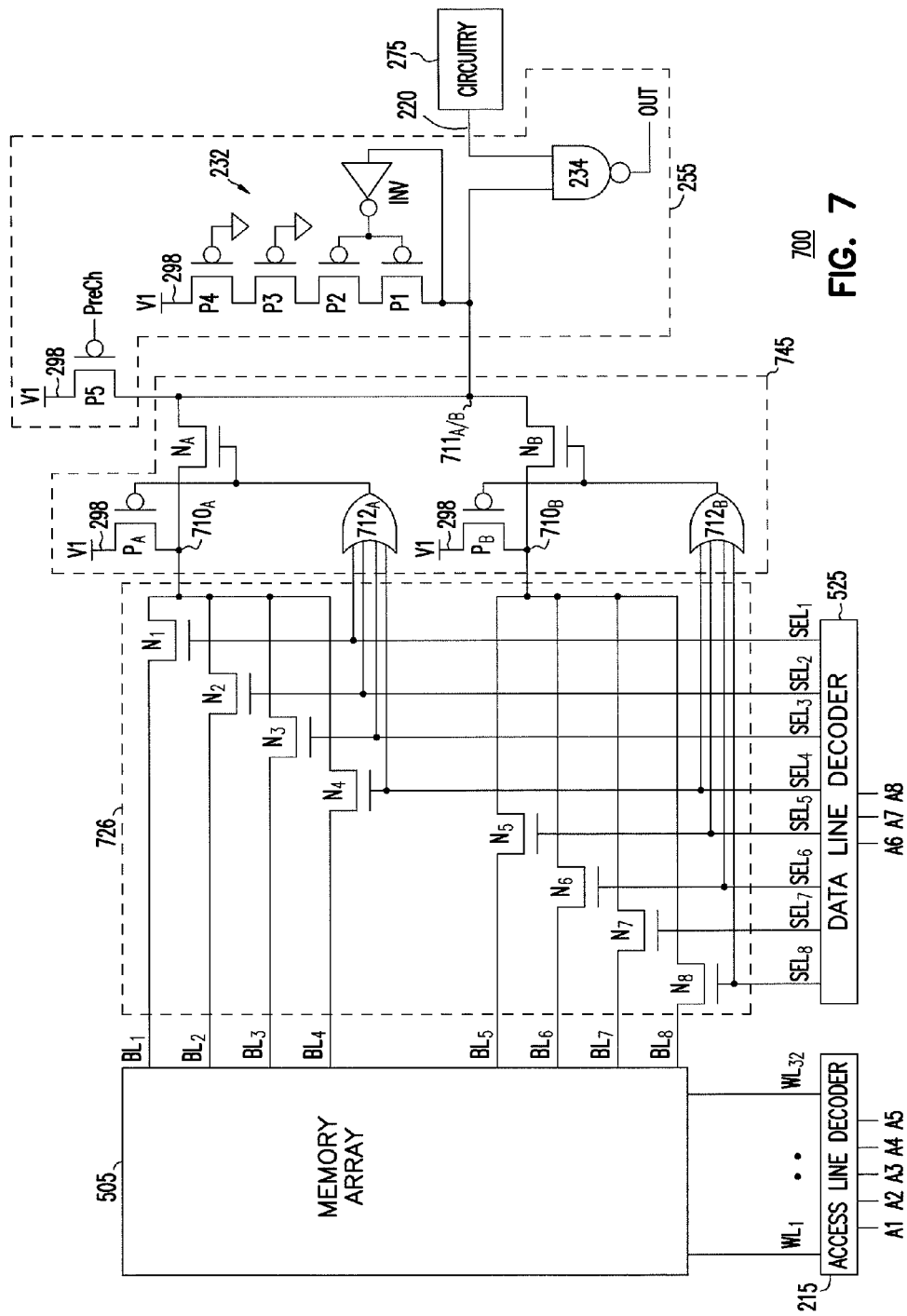
FIG. 7 shows a memory device including another encoded data line-multiplexer, according to some embodiments described herein.

FIG. 7 shows a memory device 700 including another encoded data line-multiplexer, according to some embodiments described herein. Memory device 700 can include elements similar to, or identical to, those of memory device 500 (FIG. 5). For simplicity, similar or identical elements between memory devices 500 and 700 are given the same labels. As shown in FIG. 7, memory device 700 can include a memory array 505, a gating circuit 726, a selector 745, output circuit 255, access line decoder 215, access lines $WL_1$ through $WL_{32}$, and data line decoder 525. Gating circuit 726 and selector 745 may form an encoded data line-multiplexer of memory device 700.

Differences between memory devices 500 and 700 include the connections of transistors $N_1$ through $N_8$ of gating circuit 726 at nodes $710_A$ and $710_B$ (e.g., intermediate nodes), and the arrangement of selector 745. As shown in FIG. 7, selector 745 can include transistors $N_A$ and $N_B$, pull-up components $P_A$ and $P_B$, and gates $712_A$ and $712_B$ to control (e.g., turn on or turn off) corresponding transistors $N_A$ and $N_B$ and pull-up components $P_A$ and $P_B$. Logic gate $712_A$ can operate to control transistor $N_A$ and pull-up component $P_A$ based on the levels of the signals on select lines $SEL_1$, $SEL_2$, $SEL_3$, and $SEL_4$. Logic gate $712_B$ can operate to control transistor $N_B$ and pull-up component $P_B$ based on the levels of the signals on select lines $SEL_5$, $SEL_6$, $SEL_7$, and $SEL_8$.

The arrangement of gating circuit 726 (e.g., transistors $N_1$ through $N_8$) and selector 745 (e.g., gates $712_A$ and $712_B$, and transistors $N_A$ and $N_B$), as shown in FIG. 7, may form an encoded data line-multiplexer (e.g., a 4:1 MUX followed by a 2:1 MUX). This encoded data line-multiplexer combined with data line decoder 725 allows memory device 700 to selectively form a circuit path between data lines $BL_1$ through $BL_8$ and a node $711_{A/B}$ (e.g., an output evaluation node) during a read operation.

During a read operation, selector 745 can form a circuit path between a selected data line (e.g., one of data lines $BL_1$ through $BL_8$) and a node $711_{A/B}$. This may cause the value of the voltage at node $711_{A/B}$ to be based on the value of information stored in the selected memory cell. Output circuit 255 can operate to generate output information OUT that has a value (e.g., binary 0 or 1) based on the value of voltage at node $711_{A/B}$. The value of output information OUT reflects the value of information stored in the selected memory cell associated with the selected data line.

During a read operation, only one of transistors $N_A$ and $N_B$ can be turned on at a time to form a circuit path between node $710_A$ and one of data lines BL1-8 associated a selected memory cell. During a read operation, the pull-up component (e.g., one of $P_A$ and $P_B$) associated with the selected data line (one of $BL_1$ through $BL_8$) can be turned off, and the pull-up components associated with unselected data lines can be turned on.

Selector 745 can improve operations of memory device 700 in ways similar to selector 545 of memory device 500. For example, the loading at node $711_{A/B}$, contention between keeper 232 and the selected memory cell, and read-delay during a read operation may be improved.

Figure 8:
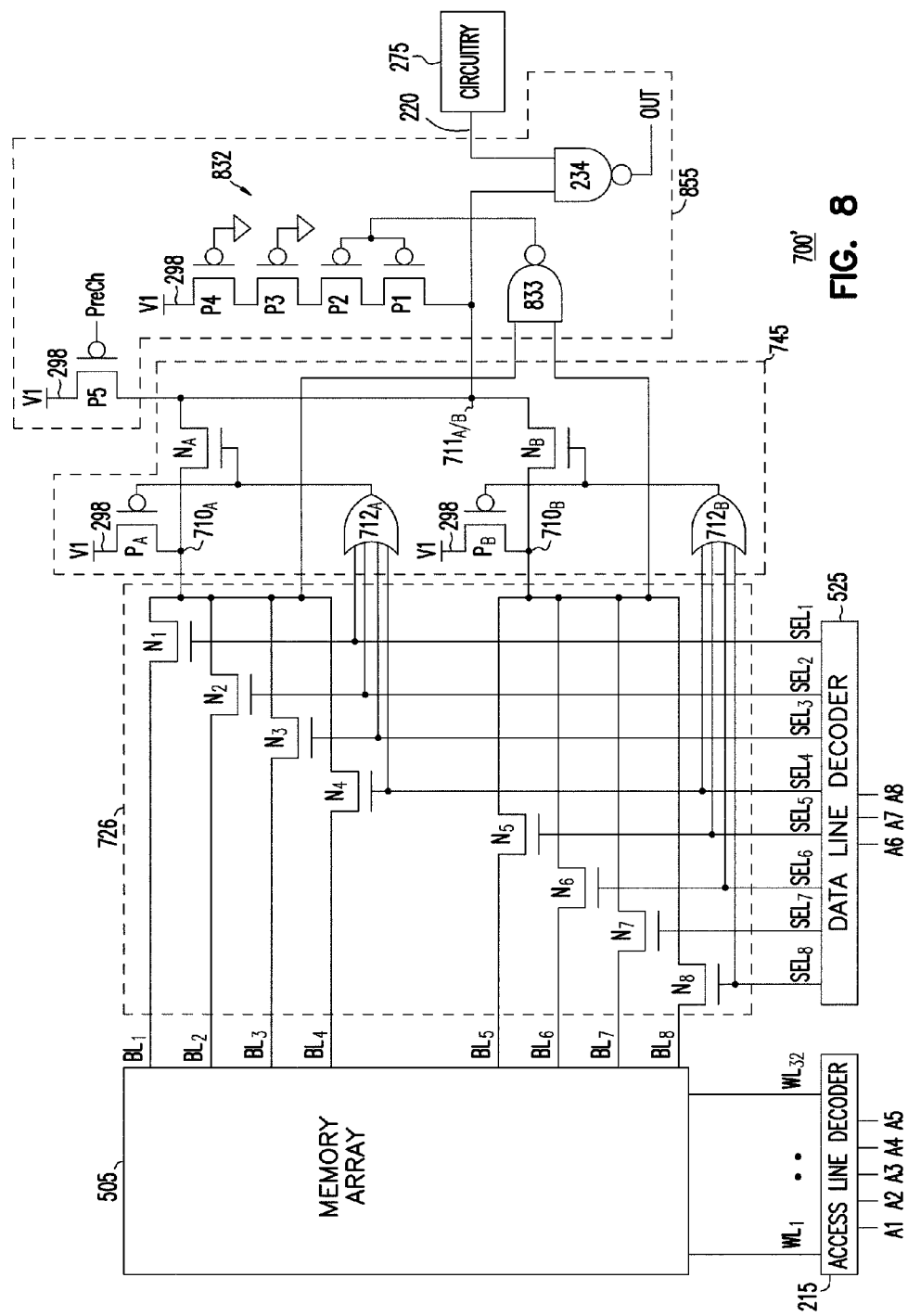
FIG. 8 shows a memory device that can be a variation of the memory device of FIG. 7, according to some embodiments described herein.

FIG. 8 shows a memory device 700', which can be a variation of memory device 700 of FIG. 7, according to some embodiments described herein. Memory device 700' can include elements similar to, or identical to, those of memory device 700 (FIG. 7). For simplicity, similar or identical elements between memory devices 700 and 700' are given the same labels. Description of such similar or identical elements is not repeated in the description of FIG. 8.

Memory device 700' can include memory array 505, access line decoder 215, data line decoder 525, gating circuit 526, selector 745, and output circuit 855 including keeper 832. Keeper 832 can include transistors P1, P2, P3, and P4 and logic gate 833 (e.g., multi-input logic NAND gate). The gate terminals of transistor P1 and P2 are coupled to the output of logic gate 833. The inputs of logic gate 833 are coupled to nodes $710_A$ and $710_B$. The function of keeper 832 is similar to the function of keeper 232 (FIG. 7). For example, during a read operation, keeper 832 can operate to keep (e.g., or to cause) value of voltage at node $711_{A/B}$ to be based on the value of information stored in a selected memory.

Differences between memory devices 700 and 700' include differences in the structures of keepers 232 and 832.

In FIG. 7, inverter INV controls the switching of (e.g., turn on or turn off) keeper 232 based on the value of the voltage at node $711_{A/B}$. In FIG. 8, logic gate 833 controls the switching of (e.g., turn on or turn off) keeper 832. For example, in FIG. 8, keeper 832 can be turned off by logic gate 833 based on the value of the voltage at nodes $710_A$ and $710_B$ instead of the value of the voltage at node $711_{A/B}$. Thus, keeper 832 of FIG. 8 may be turned off by logic gate 833 earlier than keeper 232 (FIG. 7) being turned off by inverter INV of FIG. 7.

In comparison with memory device 700 or with some conventional ROM devices, turning off keeper 832 of memory device 700' earlier, as described above, may further improve (e.g., mitigate) contention between keeper 832 and the selected memory cell and further improve the read-delay during a read operation. This may also allow memory device 200' to operate at a minimum operating voltage (e.g., Vmin) having a lower value than the value of a minimum operating voltage of some conventional ROM memory devices. In addition to the improvements described here with reference to FIG. 8, memory device 700' also has other improvements that memory device 700 has, such as the improvements described above with reference to FIG. 7.

As described above with reference to FIG. 2 through FIG. 8, the encoded data line-multiplexers (e.g., encoded column-multiplexers) may allow the memory devices described above to have improvements in comparison with some conventional memory devices. In some cases, the memory device (FIG. 2 through FIG. 8) may operate at relatively lower minimum operating voltage in comparison with some conventional memory devices that may operate at a relatively higher minimum operating voltage.

Figure 9:
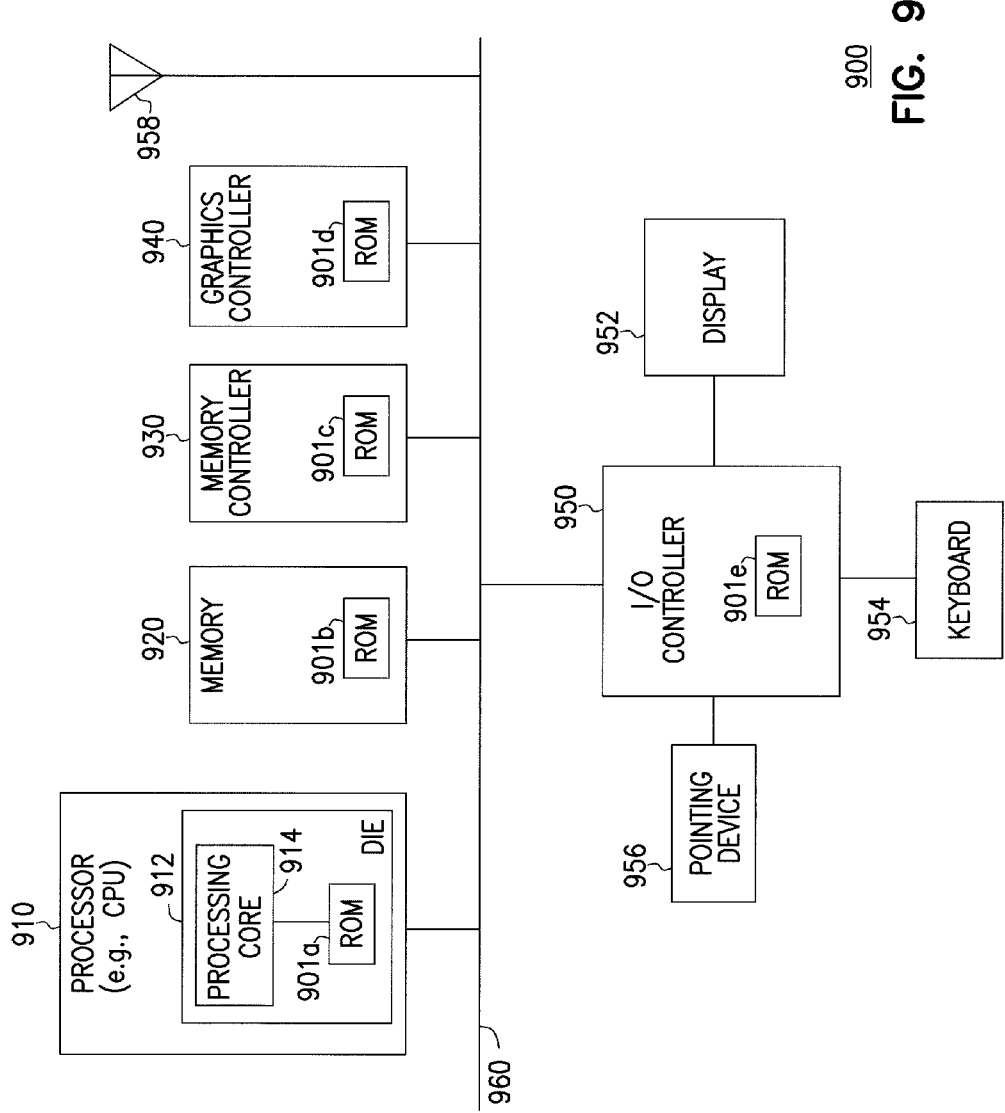
FIG. 9 shows a block diagram of an apparatus in the form of a system (e.g., electronic system), according to some embodiments described herein.

FIG. 9 shows an apparatus in the form of a system (e.g., electronic system) 900, according to some embodiments described herein. System 900 can include or be included in a computer (e.g., desktop or notebook computer), a tablet, a cellular telephone, and other electronic devices or systems. As shown in FIG. 9, system 900 can include a processor 910, a memory 920, a memory controller 930, a graphics controller 940, an input and output (I/O) controller 950, a display 952, a keyboard 954, a pointing device 956, at least one antenna 958, and a bus 960.

Processor 910 can include a general-purpose processor or an application specific integrated circuit (ASIC). Memory 920 can include a DRAM device, an SRAM device, a flash memory device, a phase change memory, or a combination of these memory devices. Memory 920 may include other types of memory. I/O controller 950 can include a communication module for wired or wireless communication (e.g., communication through one or more antenna 958). Display 952 can include a liquid crystal display (LCD), a touchscreen (e.g., capacitive or resistive touchscreen), or another type of display. Pointing device 956 can include a mouse, a stylus, or another type of pointing device.

FIG. 9 shows the components of system 900 arranged separately from each other as an example. In some arrangements, two or more components of system 900 can be located on the same die (e.g., same chip) that forms a system-on-chip (SoC).

As shown in FIG. 9, system 900 can include ROM devices 901a, 910b, 901c, 901d, and 901e located in (e.g., embedded in) processor 910, a memory 920, a memory controller 930, a graphics controller 940, an input and output (I/O) controller 950, respectively. A ROM device 901 can be used to store information (e.g., unchangeable information), such as codes (e.g., micro-codes), instructions, words library, lookup table, or other information. Each of ROM devices 901a, 910b, 901c, 901d, and 901e can include any of memory device 100, 200, 200', 500, 500', 700, and 700' and operations (e.g., read operations) described above with reference to FIG. 1 through FIG. 8.

As shown in FIG. 9, processor 910 can include a die (e.g., semiconductor die) 912 and a processing core 914 in which a ROM device 901 can be included (e.g., embedded in the same die 912 with processing core 914). Processor 910 can include a central processing unit (CPU) where processing core 914 and ROM device 901a can be part of the CPU.

FIG. 9 shows an example of system 900 where each of processor 910, a memory 920, a memory controller 930, a graphics controller 940, an input and output (I/O) controller 950 includes a ROM device (e.g., one of ROM devices 901a, 910b, 901c, 901d, and 901e). In an alternative arrangement of system 900, one or more of processor 910, a memory 920, a memory controller 930, a graphics controller 940, an input and output (I/O) controller 950 may not include a ROM device shown in FIG. 9. Thus, in such an alternative arrangement, one or more of ROM devices 901a, 910b, 901c, 901d, and 901e may be omitted from system 900.

Figure 10:
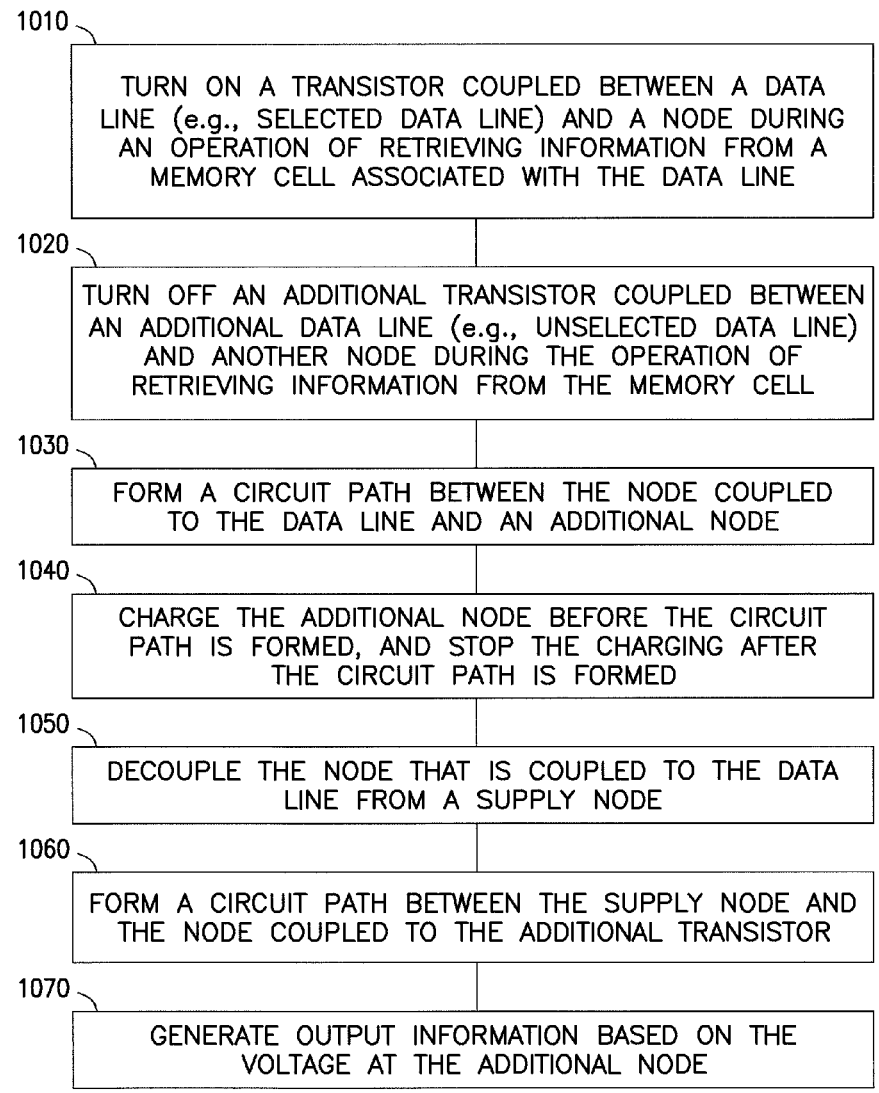
FIG. 10 is a flow diagram showing a method of operating a memory device, according to some embodiments described herein.

FIG. 10 is a flow diagram showing a method 1000 of operating a memory device, according to some embodiments described herein. Method 1000 can be performed by a memory device, such as any of memory device 100, 200, 200', 500, 500', 700, and 700', 901a, 901b, 901c, 901d, and 901e described above with reference to FIG. 1 through FIG. 9. At least a portion of method 1000 may be implemented by software, firmware, hardware or any combination of software, firmware, and hardware.

As shown in FIG. 10, method 1000 can include activity 1010, 1020, 1030, 1040, 1050, 1060, and 1070. Activity 1010 can include turning on a transistor coupled between a data line (e.g., a selected data line) and a node (e.g., an intermediate node) during an operation of retrieving information from a memory cell. The transistor can include transistor $N_1$ or $N_2$ in FIG. 2, FIG. 4, FIG. 5, and FIG. 6, and any of transistors $N_1$ through $N_4$ in FIG. 7 and FIG. 8. The node can include node 211a in FIG. 2, FIG. 4, FIG. 5, and FIG. 6, or node $710_A$ in FIG. 7 and FIG. 8.

Activity 1020 can include turning off an additional transistor (e.g., an unselected data line) coupled between an additional data line (e.g., an unselected data line) and another node (e.g., another intermediate node) during the operation of retrieving information from the memory cell associated with the data line. The additional transistor in activity 1020 can include any of transistors $N_3$ and $N_4$ in FIG. 2 and FIG. 4, any of transistors $N_3$ through N8 in FIG. 5 and FIG. 6, or any of transistors N5 through N8 in FIG. 7 and FIG. 8.

Activity 1030 can include forming a circuit path between the node coupled to the data line (e.g., the selected data line) and an additional node (e.g., an output evaluation node). The additional node can include node $211_{A/B}$ in FIG. 2 and FIG. 4, node $511_{A/B/C/D}$ in FIG. 5 and FIG. 6, or node $711_{A/B}$ in FIG. 7 and FIG. 8.

Activity 1040 can include charging the additional node before the circuit path is formed, and stopping the charging after the circuit path is formed.

Activity 1050 can include decoupling the node that is coupled to the data line (e.g., the selected data line) from a supply node. The decoupling may be can be performed right after the data line is coupled to the node.

Activity 1060 can include forming a circuit path between the supply node and the node coupled to the additional transistor (which is coupled to the unselected data). Forming the circuit path in activity 1060 may be performed right after the data line (e.g., the selected data line) is coupled to the node.

Activity 1070 can include generating output information (e.g., information OUT) based on the voltage at the additional node. The output information has a value indicating a value of the information stored in the memory cell.

At least some of activities of method 1000 may be performed in parallel (e.g., performed concurrently). For example, activities 1010 and 1020 may be performed in parallel. Activities 1050 and 1060 may be performed in parallel. Method 1000 can include additional activities (e.g., operations) of a memory device described above with reference to FIG. 1 through FIG. 9.

The embodiments described may be implemented in one or a combination of hardware, firmware and software. Embodiments may also be implemented as instructions stored on a computer-readable storage medium, which may be read and executed by at least one processor to perform the operations and activities described herein. A computer-readable storage medium may include any non-transitory mechanism for storing information (e.g., instructions) in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors (e.g., processor 910) may be configured with the instructions to perform the operations and activities described herein.

The illustrations of apparatus (e.g., memory devices 100, 200, 200', 500, 500', 700, and 700', and system 900) and methods (e.g., method 1000 and the operations of memory devices 100, 200, 200', 500, 500', 700, and 700', and system 900) described above with reference to FIG. 1 through FIG. 10) are intended to provide a general understanding of the structure of various embodiments and are not intended to provide a complete description of all the elements and features of apparatuses that might make use of the structures described herein.

The apparatus (e.g., memory devices 100, 200, 200', 500, 500', 700, and 700', and system 900) and methods (e.g., method 1000 and the operations of memory devices 100, 200, 200', 500, 500', 700, and 700', and system 900) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

ADDITIONAL NOTES AND EXAMPLES

Example 1 includes subject matter (such as a device, an electronic apparatus (e.g., circuit, electronic system, or both), or a machine) including non-volatile memory cells, a data line associated with a group of non-volatile memory cells of the non-volatile memory cells, a first transistor coupled to the data line and a node, a second transistor coupled to the node and an additional node, a pull-up component coupled to the node and a supply node, and an additional pull-up component coupled to the additional node and the supply node.

In Example 2, the subject matter of Example 1 may optionally include, further comprising at least one transistor coupled between the additional node and the supply node, and a logic gate having an input coupled to the node and an output coupled to a gate terminal of the at least one transistor.

In Example 3, the subject matter of Example 1 or 2 may optionally include, further comprising an additional data line associated with an additional group of non-volatile memory cells of the non-volatile memory cells, a third transistor, wherein the node is a first node and the third transistor is coupled to the additional data line and a second node, a fourth transistor coupled to the second node and the additional node, wherein the pull-up component is a first pull-up component, and a second pull-up component coupled to the second node and the supply node.

In Example 4, the subject matter of Example 3 may optionally include, further comprising a decoder having a first output coupled to a gate terminal of the first transistor and to a second output coupled to a gate terminal of the third transistor.

In Example 5, the subject matter of Example 4 may optionally include, further comprising a logic gate having an input coupled to the gate terminal of the first transistor, and an output coupled to a gate terminal of the second transistor and to a gate terminal of a transistor included in the first pull-up component.

In Example 6, the subject matter of Example 5 may optionally include, further comprising an additional logic gate having an input coupled to a gate terminal of the third transistor, and an output coupled to a gate terminal of the fourth transistor and a gate terminal of a transistor included in the second pull-up component.

Example 7 includes subject matter (such as a device, an electronic apparatus (e.g., circuit, electronic system, or both), or a machine) including first data lines associated first memory cells, second data lines associated with second memory cells, a circuit including first transistors and second transistors, each of the first data lines coupled to a first node through one of the first transistors, each of the second data lines coupled to a second node through one of the second transistors, a selector including a first transistor coupled to the first node and an additional node, a second transistor coupled to the second node and the additional node, a first pull-up component coupled to the first node and a supply node, and a second pull-up component coupled to the second node and the supply node, and an additional pull-up component to couple to the additional node and the supply node.

In Example 8, the subject matter of Example 7 may optionally include, further comprising a plurality of transistors coupled in series between the additional node and the supply node, and a logic gate having a first input coupled to the first node, a second input coupled to the second node, and an output coupled to a gate terminal of at least one transistor in the plurality of transistors.

In Example 9, the subject matter of Example 7 or 8 may optionally include, wherein the selector further includes a first logic gate having inputs coupled to gate terminals of the first transistors of the circuit, and an output coupled to the first transistor of the selector and the first pull-up component, and a second logic gate having inputs coupled to gate terminals of the second transistors of the circuit, and an output coupled to the second transistor of the selector and the second pull-up component.

In Example 10, the subject matter of Example 7 or 8 may optionally include, wherein each of the first and second transistors includes a gate coupled to an output of a decoder.

In Example 11, the subject matter of Example 7 or 8 may optionally include, wherein the first pull-up component includes only one transistor coupled between the first node and the supply node, and the second pull-up component includes only one transistor coupled between the second node and the supply node.

In Example 12, the subject matter of Example 7 or 8 may optionally include, wherein the additional the pull-up component includes a transistor coupled between the additional node and the supply node.

In Example 13, the subject matter of Example 7 or 8 may optionally include, wherein the first and second memory cells include read-only memory cells.

Example 14 includes subject matter (such as a device, an electronic apparatus (e.g., circuit, electronic system, or both), or a machine) including first data lines associated first memory cells, second data lines associated with second memory cells, a circuit to form a circuit path between a first node and a data line among the first data lines if a memory cell among the first memory cells is selected during an operation of retrieving information from at least one of the first memory cells, and to form a circuit path between a second node and a data line among the second data lines if a memory cell among the second memory cells is selected during an operation of retrieving information from at least one of the second memory cells, and a selector to form a circuit path between an additional node and one of the first and second nodes and during the operation of retrieving information from at least one of the first and second memory cells, to decouple the first node from a supply node and to form a circuit path between the second node and the supply node if a memory among the first memory cells is selected, and to form a circuit path between the first node and the supply node and to decouple the second node from a supply node if the memory among the second memory cells is selected.

In Example 15, the subject matter of Example 14 may optionally include, further comprising a component to charge the additional node before the selector forms a circuit path between the additional node and one of the first and second nodes.

In Example 16, the subject matter of Example 14 or 15 may optionally include, further comprising an output circuit to control at least one transistor coupled in series between the additional node and the supply node based on voltages at the first and second nodes.

In Example 17, the subject matter of Example 14 or 15 may optionally include, further comprising an output circuit to generate output information based on a voltage at the additional node, the output information having a value indicating a value of information stored in one of the first and second memory cells.

Example 18 includes subject matter (such as a device, an electronic apparatus (e.g., circuit, electronic system, or both), or a machine) including a processing core included in a die, and a read-only-memory (ROM) device included in the die and coupled to the processing core, the ROM including a data line associated with a group of non-volatile memory cells, a first transistor coupled to the data line and a node, a second transistor coupled to the node and an additional node, a pull-up component coupled to the node and a supply node, and an additional pull-up component coupled to the additional node and the supply node.

In Example 19, the subject matter of Example 18 may optionally include, wherein the processing core includes a node coupled to the supply node.

In Example 20, the subject matter of Example 18 or 19 may optionally include, wherein the processing core is part of a central processing unit.

Example 21 includes subject matter (such as a device, an electronic apparatus (e.g., circuit, electronic system, or both), or a machine) including a first data line associated with a first group of memory cells, a first transistor coupled to the first data line and a first node, a second data line associated with a second group of memory cells, a second transistor coupled to the second data line and the first node, a third data line associated with a third group of memory cells, a third transistor coupled to the third data line and a second node, a fourth data line associated with a fourth group of memory cells, a fourth transistor coupled to the fourth data line and the second node, a first pull-up component coupled to the first node and a supply node, a second pull-up component coupled to the second node and the supply node, a first additional transistor coupled to the first node and an additional node, a second additional transistor coupled to the second node and the additional node, and an additional pull-up component coupled to the additional node and the supply node.

In Example 22, the subject matter of Example 21 may optionally include, further comprising additional transistors coupled in series between the additional node and the supply node, and a logic gate including a first input coupled to the first node, a second input coupled to the second node, and an output coupled to a gate terminal of at least one of the additional transistors.

In Example 23, the subject matter of Example 21 or 22 may optionally include, further comprising a first logic gate having inputs coupled to gate terminals of the first and second transistors, and an output coupled to a gate terminal of the first additional transistor and to a gate terminal of a transistor included in the first pull-up component, and a second logic gate having inputs coupled to gate terminals of the third and fourth transistors, and an output coupled to a gate terminal of the second additional transistor and to a gate terminal of a transistor included in the second pull-up component.

In Example 24, the subject matter of Example 23 may optionally include, further comprising a decoder, the decoder including a first output coupled to a gate terminal of the first transistor, a second output coupled to a gate terminal of the second transistor, a third output coupled to a gate terminal of the third transistor, and a fourth output coupled to a gate terminal of the fourth transistor.

Example 25 includes subject matter (such as a method of operating a device, an electronic apparatus (e.g., circuit, electronic system, or both), or a machine) including turning on a first transistor coupled between a first data line and a first node during an operation of retrieving information from a memory cell associated with the first data line, turning off a second transistor coupled between a second data line and a second node during the operation of retrieving information from the memory cell associated with the first data line, forming a circuit path between the first node and an additional node, charging the additional node before the circuit path is formed, and stopping the charging after the circuit path is formed, decoupling the first node from a supply node, forming a circuit path between the second node and the supply node, and generating output information based on the voltage at the additional node, the output information having a value indicating a value of the information stored in the memory cell.

In Example 26, the subject matter of Example 25 may optionally include, further comprising turning off the first transistor during an operation of retrieving information from an additional memory cell associated with the second data line, turning on the second transistor during the operation of retrieving information from the additional memory cell, forming a circuit path between the second node and the additional node, charging the additional node before the circuit path is formed between the second node and the additional node, and stopping the charging after the additional circuit path is formed, forming a circuit path between the first node and the supply node, decoupling the second node from the supply node, and generating output information based on the voltage at the additional node, the output information having a value indicating a value of the information stored in the additional memory cell.

In Example 27, the subject matter of Example 25 may optionally include, further comprising controlling a switching of at least one transistor coupled between the additional node and the supply node based on the voltages at the first and second nodes.

In Example 28, the subject matter of Example 27 may optionally include, wherein controlling the switching includes providing the voltages at the first and second nodes to inputs of a logic gate, and providing an output of the logic gate to a gate terminal of the at least one transistor.

Example 29 includes subject matter (such as a device, an electronic apparatus (e.g., circuit, electronic system, or both), or machine) including means for performing any of the methods of Examples 25-28.

The subject matter of Example 1 through Example 29 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   non-volatile memory cells;
   a data line associated with a group of non-volatile memory cells of the non-volatile memory cells;
   a first transistor coupled to the data line and a node;
   a second transistor coupled to the node and an additional node;
   a pull-up component coupled to the node and a supply node, the pull-up component including a transistor having a gate terminal coupled to a gate terminal of the second transistor; and
   an additional pull-up component coupled to the additional node and the supply node.

2. The apparatus of claim 1, further comprising:
   an additional data line associated with an additional group of non-volatile memory cells of the non-volatile memory cells;
   a third transistor, wherein the node is a first node and the third transistor is coupled to the additional data line and a second node;
   a fourth transistor coupled to the second node and the additional node, wherein the pull-up component is a first pull-up component; and
   a second pull-up component coupled to the second node and the supply node.

3. The apparatus of claim 2, further comprising a decoder having a first output coupled to a gate terminal of the first transistor and to a second output coupled to a gate terminal of the third transistor.

4. An apparatus comprising:
   non-volatile memory cells;
   a data line associated with a group of non-volatile memory cells of the non-volatile memory cells;
   a first transistor coupled to the data line and a node;
   a second transistor coupled to the node and an additional node;
   a pull-up component coupled to the node and a supply node;
   an additional pull-up component coupled to the additional node and the supply node;
   at least one transistor coupled between the additional node and the supply node; and
   a logic gate having an input coupled to the node and an output coupled to a gate terminal of the at least one transistor.

5. An apparatus comprising:
   non-volatile memory cells;
   a data line associated with a group of non-volatile memory cells of the non-volatile memory cells;
   a first transistor coupled to the data line and a node;
   a second transistor coupled to the node and an additional node;
   a pull-up component coupled to the node and a supply node;
   an additional pull-up component coupled to the additional node and the supply node;
   an additional data line associated with an additional group of non-volatile memory cells of the non-volatile memory cells;
   a third transistor, wherein the node is a first node and the third transistor is coupled to the additional data line and a second node;
   a fourth transistor coupled to the second node and the additional node, wherein the pull-up component is a first pull-up component;
   a second pull-up component coupled to the second node and the supply node;
   a decoder having a first output coupled to a gate terminal of the first transistor and to a second output coupled to a gate terminal of the third transistor; and
   a logic gate having an input coupled to the gate terminal of the first transistor, and an output coupled to a gate terminal of the second transistor and to a gate terminal of a transistor included in the first pull-up component.

6. The apparatus of claim 5, further comprising an additional logic gate having an input coupled to a gate terminal of the third transistor, and an output coupled to a gate terminal of the fourth transistor and a gate terminal of a transistor included in the second pull-up component.

7. An apparatus comprising:
first data lines associated first memory cells;
second data lines associated with second memory cells;
a circuit including first transistors and second transistors, each of the first data lines coupled to a first node through one of the first transistors, each of the second data lines coupled to a second node through one of the second transistors;
a selector including a first transistor coupled to the first node and an additional node, a second transistor coupled to the second node and the additional node, a first pull-up component coupled to the first node and a supply node, the first pull-up component including a transistor having a gate terminal coupled to a gate terminal of the first transistor, and a second pull-up component coupled to the second node and the supply node, the second pull-up component including a transistor having a gate terminal coupled to a gate terminal of the second transistor; and
an additional pull-up component coupled to the additional node and the supply node.

8. The apparatus of claim 7, wherein each of the first and second transistors includes a gate coupled to an output of a decoder.

9. The apparatus of claim 7, wherein the first pull-up component includes only one transistor coupled between the first node and the supply node, and the second pull-up component includes only one transistor coupled between the second node and the supply node.

10. The apparatus of claim 7, wherein the additional the pull-up component includes a transistor coupled between the additional node and the supply node.

11. The apparatus of claim 7, wherein the first and second memory cells include read-only memory cells.

12. An apparatus comprising:
first data lines associated first memory cells;
second data lines associated with second memory cells;
a circuit including first transistors and second transistors, each of the first data lines coupled to a first node through one of the first transistors, each of the second data lines coupled to a second node through one of the second transistors;
a selector including a first transistor coupled to the first node and an additional node, a second transistor coupled to the second node and the additional node, a first pull-up component coupled to the first node and a supply node, and a second pull-up component coupled to the second node and the supply node;
an additional pull-up component coupled to the additional node and the supply node;
a plurality of transistors coupled in series between the additional node and the supply node; and
a logic gate having a first input coupled to the first node, a second input coupled to the second node, and an output coupled to a gate terminal of at least one transistor in the plurality of transistors.

13. An apparatus comprising:
first data lines associated first memory cells;
second data lines associated with second memory cells;
a circuit including first transistors and second transistors, each of the first data lines coupled to a first node through one of the first transistors, each of the second data lines coupled to a second node through one of the second transistors;
a selector including a first transistor coupled to the first node and an additional node, a second transistor coupled to the second node and the additional node, a first pull-up component coupled to the first node and a supply node, and a second pull-up component coupled to the second node and the supply node; and
an additional pull-up component coupled to the additional node and the supply node wherein the selector further includes:
a first logic gate having inputs coupled to gate terminals of the first transistors of the circuit, and an output coupled to the first transistor of the selector and the first pull-up component; and
a second logic gate having inputs coupled to gate terminals of the second transistors of the circuit, and an output coupled to the second transistor of the selector and the second pull-up component.

14. An apparatus comprising:
a processing core included in a die; and
a read-only-memory (ROM) device included in the die and coupled to the processing core, the ROM including:
a data line associated with a group of non-volatile memory cells;
a first transistor coupled to the data line and a node;
a second transistor coupled to the node and an additional node;
a pull-up component coupled to the node and a supply node, the pull-up component including a transistor having a gate terminal coupled to a gate terminal of the second transistor; and
an additional pull-up component coupled to the additional node and the supply node.

15. The apparatus of claim 14, wherein the processing core includes a node coupled to the supply node.

16. The apparatus of claim 14, wherein the processing core is part of a central processing unit.

* * * * *